US012742559B2

(12) United States Patent
Alanqar et al.

(10) Patent No.: US 12,742,559 B2
(45) Date of Patent: Sep. 22, 2026

(54) DIRECT EVAPORATIVE COOLING SYSTEM FOR DATA CENTER WITH FAULT DETECTION

(71) Applicant: Tyco Fire & Security GmbH, Neuhausen am Rheinfall (CH)

(72) Inventors: Anas W. I. Alanqar, Milwaukee, WI (US); Michael J. Wenzel, Grafton, WI (US)

(73) Assignee: TYCO FIRE & SECURITY GMBH, Neuhausen am Rheinfall (CH)

( * ) Notice: Subject to any disclaimer, the term of this patent is extended or adjusted under 35 U.S.C. 154(b) by 596 days.

(21) Appl. No.: 18/308,418

(22) Filed: Apr. 27, 2023

(65) Prior Publication Data

US 2023/0349567 A1 Nov. 2, 2023

Related U.S. Application Data

(60) Provisional application No. 63/403,016, filed on Sep. 1, 2022, provisional application No. 63/403,018, filed (Continued)

(51) Int. Cl.
*F24F 5/00* (2006.01)
*F24F 11/64* (2018.01)
(Continued)

(52) U.S. Cl.
CPC ............ *F24F 5/0035* (2013.01); *F24F 11/64* (2018.01); *H05K 7/20745* (2013.01);
(Continued)

(58) Field of Classification Search
CPC .... F24F 5/0035; F24F 11/64; H05K 7/20745; H05K 7/20827; H05K 7/20836
(Continued)

(56) References Cited

U.S. PATENT DOCUMENTS 5,292,280 A 3/1994 Janu et al.
6,219,590 B1 4/2001 Bernaden, III et al.
(Continued)

FOREIGN PATENT DOCUMENTS

CN 108448944 B 8/2018
CN 109189190 B 1/2019
(Continued)

OTHER PUBLICATIONS

PCT Invitation to Pay Additional Fees and, Where Applicable, Protest Fee Communication with Search Report for PCT Appl. Ser. No. PCT/US2023/020264 dated Aug. 24, 2023 (25 pages).
(Continued)

*Primary Examiner* — Avinash A Savani
*Assistant Examiner* — Dana K Tighe
(74) *Attorney, Agent, or Firm* — Foley & Lardner LLP

(57) ABSTRACT

Systems and methods for detecting and correcting faults in direct evaporative cooling units are provided. In an exemplary embodiment, direct evaporative cooling affects a humidity and a temperature of the data center. An exemplary method includes generating expected values for the humidity of the data center and expected values for the temperature of the data center using a model. A fault condition is determined in response to the actual values for the humidity deviating from the expected values for the humidity while actual values for the temperature track the expected values for the temperature, or in response to the actual values for the temperature deviating from the expected values for the temperature while actual values for the humidity track the expected values for the humidity.

20 Claims, 18 Drawing Sheets

Related U.S. Application Data on Sep. 1, 2022, provisional application No. 63/336,240, filed on Apr. 28, 2022.

(51) Int. Cl.
*H05K 7/20* (2006.01)
*F24F 110/12* (2018.01)
*F24F 110/22* (2018.01)

(52) U.S. Cl.
CPC ..... *H05K 7/20827* (2013.01); *H05K 7/20836* (2013.01); *F24F 2110/12* (2018.01); *F24F 2110/22* (2018.01)

(58) Field of Classification Search
USPC .......................................................... 454/184
See application file for complete search history.

(56) References Cited

U.S. PATENT DOCUMENTS 6,813,897 B1 11/2004 Bash et al.
7,331,378 B2 2/2008 Bhatti et al.
7,606,029 B2 10/2009 Mahalingam et al.
7,607,470 B2 10/2009 Glezer et al.
7,609,518 B2 10/2009 Hopton et al.
7,748,436 B1 7/2010 Anderson et al.
7,760,499 B1 7/2010 Darbin et al.
7,953,574 B2 * 5/2011 Arakawa ............... G06F 1/3221 702/132
8,002,021 B1 8/2011 Zuo et al.
8,120,919 B2 2/2012 Lyon
8,210,506 B1 7/2012 Ellis
8,286,693 B2 10/2012 Whitney et al.
8,369,090 B2 2/2013 Chester
8,382,456 B2 2/2013 Scott
8,532,839 B2 9/2013 Drees et al.
8,605,437 B2 12/2013 Wei et al.
8,616,267 B2 12/2013 Capriz et al.
8,731,724 B2 5/2014 Drees et al.
8,755,943 B2 6/2014 Wenzel
8,820,351 B1 9/2014 Harrington et al.
8,937,482 B1 1/2015 Lemczyk
9,010,141 B2 4/2015 Harrington
9,042,100 B2 5/2015 Kang
9,052,252 B2 6/2015 Lyon et al.
9,055,697 B2 6/2015 Lyon
9,075,582 B2 7/2015 Campbell et al.
9,135,667 B2 9/2015 Drees et al.
9,152,610 B2 10/2015 Drees et al.
9,161,480 B2 10/2015 Harrington
9,196,009 B2 11/2015 Drees et al.
9,204,574 B1 12/2015 Pounds et al.
9,212,327 B2 12/2015 Diver
9,235,657 B1 1/2016 Wenzel et al.
9,313,929 B1 4/2016 Malone et al.
9,348,392 B2 5/2016 Drees et al.
9,354,968 B2 5/2016 Wenzel et al.
9,410,536 B2 8/2016 Lamb et al.
9,466,551 B1 10/2016 Reist et al.
9,471,722 B2 10/2016 Drees et al.
9,496,200 B2 11/2016 Lyon et al.
9,521,783 B2 12/2016 Leckelt et al.
9,534,852 B2 1/2017 Gierl et al.
9,568,257 B2 2/2017 Moruzzi
9,568,910 B2 2/2017 Drees et al.
9,578,781 B2 2/2017 Slippey et al.
9,595,726 B2 3/2017 Chen et al.
9,599,408 B1 3/2017 Hartenstine et al.
9,603,284 B2 3/2017 Lyon
9,606,520 B2 3/2017 Noboa et al.
9,618,275 B1 4/2017 Anderson et al.
9,635,786 B2 4/2017 Leckelt et al.
9,753,455 B2 9/2017 Drees
9,879,663 B2 1/2018 Ellis
9,907,214 B2 2/2018 Dagley et al.
9,909,820 B2 3/2018 Lyon
9,943,014 B2 4/2018 Lyon et al.
10,034,403 B1 7/2018 Flannery et al.
10,054,324 B2 * 8/2018 Marchetti ................ F24F 11/80
10,054,371 B2 8/2018 Espersen et al.
10,120,375 B2 11/2018 Przybylski et al.
10,123,464 B2 11/2018 Moore et al.
10,180,261 B1 1/2019 Ross et al.
10,206,307 B2 2/2019 Lau
10,215,440 B1 2/2019 Reist et al.
10,215,501 B1 2/2019 Reist et al.
10,282,796 B2 5/2019 Elbsat et al.
10,285,310 B2 5/2019 Bonar et al.
10,349,557 B2 7/2019 Bilski et al.
10,359,748 B2 7/2019 Elbsat et al.
10,364,809 B2 7/2019 Lyon et al.
10,365,667 B2 7/2019 Lyon et al.
10,386,121 B2 8/2019 Tang et al.
10,386,820 B2 8/2019 Wenzel et al.
10,415,597 B2 9/2019 Lyon
10,418,832 B2 9/2019 Wenzel et al.
10,458,719 B2 10/2019 Bozorgi et al.
10,458,724 B2 10/2019 Franz et al.
10,495,388 B1 12/2019 Zheng et al.
10,502,497 B1 12/2019 Weyant et al.
10,557,391 B1 2/2020 Chen et al.
10,582,641 B2 3/2020 Harrington
10,605,541 B1 3/2020 Zheng et al.
10,638,639 B1 4/2020 Garner et al.
10,645,847 B2 5/2020 Edwards et al.
10,655,920 B2 5/2020 Espersen et al.
10,706,375 B2 7/2020 Wenzel et al.
10,718,542 B2 7/2020 Alanqar et al.
10,739,742 B2 8/2020 Kumar et al.
10,765,983 B2 9/2020 Lau
10,767,886 B2 9/2020 Alanqar et al.
10,773,192 B1 9/2020 Lau
10,809,676 B2 10/2020 Patel et al.
10,837,712 B1 11/2020 Dechristopher et al.
10,876,754 B2 12/2020 Wenzel et al.
10,921,868 B2 2/2021 Hay
10,928,139 B1 2/2021 Weyant et al.
10,949,777 B2 3/2021 Elbsat et al.
10,956,842 B2 3/2021 Wenzel et al.
10,966,349 B1 3/2021 Lau
10,989,483 B2 4/2021 Espersen et al.
11,071,238 B2 7/2021 Edmunds et al.
11,096,313 B2 8/2021 Amos et al.
11,099,526 B2 8/2021 Wenzel et al.
11,160,194 B2 10/2021 Lau
11,164,126 B2 11/2021 Elbsat et al.
11,175,102 B1 11/2021 Harrington et al.
11,238,547 B2 2/2022 Elbsat et al.
11,281,173 B2 3/2022 Turney et al.
11,317,535 B2 4/2022 Harrington
11,337,340 B2 5/2022 Harrington
11,353,270 B1 6/2022 Fritch et al.
11,365,133 B1 6/2022 Cao et al.
11,379,935 B2 7/2022 Wenzel
11,395,443 B2 7/2022 Varela Benitez et al.
11,408,683 B1 8/2022 Shaeri et al.
11,408,684 B1 8/2022 Richard et al.
11,452,243 B2 9/2022 Lyon et al.
11,454,462 B2 9/2022 Whitney et al.
11,473,860 B2 10/2022 Holden et al.
11,480,394 B2 10/2022 North
11,490,546 B2 11/2022 Edmunds et al.
11,496,073 B2 11/2022 Larson
11,497,144 B2 11/2022 Albinger et al.
11,523,545 B2 12/2022 Karrat et al.
11,528,827 B2 12/2022 Lau
11,535,407 B1 12/2022 Tarau et al.
11,596,082 B2 2/2023 Amos et al.
11,611,192 B2 3/2023 Amalfi et al.
11,650,015 B2 5/2023 Kang
11,656,665 B2 5/2023 Heydari
11,662,037 B2 5/2023 Lyon
11,747,800 B2 9/2023 Elbsat et al.
11,767,992 B2 9/2023 Sweeney et al.

(56) References Cited

U.S. PATENT DOCUMENTS 11,803,174 B2 10/2023 Elbsat et al.
11,821,653 B2 11/2023 Sweeney et al.
11,859,914 B2 1/2024 Bozorgi
11,882,673 B1 1/2024 Weyant et al.
11,910,576 B2 2/2024 Heydari
11,917,796 B2 2/2024 Longhurst et al.
11,917,799 B2 2/2024 Zwijze et al.
11,924,996 B2 3/2024 Zakaib et al.
11,976,844 B2 5/2024 Sweeney et al.
11,991,866 B2 5/2024 Salim et al.
12,024,360 B2 7/2024 Lau
12,050,061 B2 7/2024 Kang
12,082,382 B2 9/2024 Heydari
12,096,595 B2 9/2024 Cushen et al.
12,163,739 B2 12/2024 Cennamo et al.
12,185,498 B2 12/2024 Najjari et al.
12,188,733 B2 1/2025 Mostafavi Yazdi et al.
12,193,197 B2 1/2025 Gao
12,200,914 B2 1/2025 Turner et al.
2009/0133866 A1 5/2009 Campbell et al.
2009/0207567 A1 8/2009 Campbell et al.
2011/0132579 A1 6/2011 Best et al.
2012/0303166 A1 11/2012 Chang
2014/0129044 A1 5/2014 Wenzel
2014/0278165 A1 9/2014 Wenzel et al.
2015/0316903 A1 11/2015 Asmus et al.
2015/0316907 A1 11/2015 Elbsat et al.
2016/0062340 A1 3/2016 Ogawa et al.
2016/0154389 A1 6/2016 Drees et al.
2016/0195866 A1 7/2016 Turney et al.
2016/0234972 A1 8/2016 Billet et al.
2016/0338230 A1 11/2016 Kaplan et al.
2016/0379319 A1 12/2016 Drees et al.
2017/0231118 A1 8/2017 Cader et al.
2017/0367222 A1 12/2017 Heydari
2018/0075549 A1 3/2018 Turney et al.
2018/0314220 A1 11/2018 Kumar et al.
2019/0162436 A1 5/2019 Albinger et al.
2019/0212712 A1 7/2019 Wenzel et al.
2019/0219293 A1 7/2019 Wenzel et al.
2020/0218233 A1 7/2020 Elbsat et al.
2020/0218991 A1 7/2020 Alanqar et al.
2020/0284464 A1 9/2020 Abdel-Salam et al.
2020/0370771 A1 11/2020 Alanqar et al.
2020/0371482 A1 11/2020 Alanqar et al.
2020/0379423 A1 12/2020 Wenzel et al.
2021/0010693 A1 1/2021 Gamroth et al.
2021/0010701 A1 1/2021 Nesler et al.
2021/0018198 A1 1/2021 Alanqar et al.
2021/0034024 A1 2/2021 Patel et al.
2021/0041127 A1 2/2021 Risbeck et al.
2021/0055701 A1 2/2021 Elbsat et al.
2021/0180891 A1 6/2021 Rousselet et al.
2021/0190349 A1 6/2021 Turney et al.
2021/0190355 A1 6/2021 Tokudi et al.
2021/0192469 A1 6/2021 Turney et al.
2022/0034543 A1 2/2022 Alanqar et al.
2022/0035357 A1 2/2022 Elbsat et al.
2022/0092500 A1 3/2022 Drees et al.
2022/0137580 A1 5/2022 Burroughs et al.
2022/0186962 A1 6/2022 Turney et al.
2022/0252285 A1 8/2022 Sweeney et al.
2022/0299966 A1 9/2022 Shadbolt et al.
2022/0338387 A1 10/2022 Enright et al.
2022/0400579 A1 12/2022 Longhurst et al.
2023/0020417 A1 1/2023 Elbsat et al.
2023/0029001 A1 1/2023 Edmunds et al.
2023/0048341 A1 2/2023 Alanqar et al.
2023/0062986 A1 3/2023 Chehade et al.
2023/0083799 A1 3/2023 Shaw et al.
2023/0088808 A1 3/2023 Patel et al.
2023/0167988 A1 6/2023 Sweeney et al.
2023/0167989 A1 6/2023 Sweeney et al.
2023/0219297 A1 7/2023 Moo et al.
2023/0253787 A1 8/2023 Wenzel et al.
2023/0284414 A1 9/2023 Kang et al.
2023/0288000 A1 9/2023 Mehmi et al.
2023/0288147 A1 9/2023 Enright et al.
2023/0349567 A1 11/2023 Alanqar et al.
2023/0350436 A1 11/2023 Lyon et al.
2023/0354562 A1 11/2023 Alanqar et al.
2023/0397368 A1 12/2023 Whitney et al.
2024/0004483 A1 1/2024 Whitney et al.
2024/0008220 A1 1/2024 Kadhim et al.
2024/0023282 A1 1/2024 Amalfi et al.
2024/0032243 A1 1/2024 Matteson et al.
2024/0044583 A1 2/2024 Amalfi et al.
2024/0098944 A1 3/2024 Edmunds et al.
2024/0102749 A1 3/2024 Amalfi et al.
2024/0130089 A1 4/2024 Salim et al.
2024/0172402 A1 5/2024 Shapiro et al.
2024/0407142 A1 12/2024 Bernat et al.
2025/0024630 A1 1/2025 Ge et al.
2025/0024640 A1 1/2025 Najjari et al.
2025/0063688 A1 2/2025 Peterson et al.
2025/0071937 A1 2/2025 Zakaib et al.
2025/0102238 A1 3/2025 Loyst et al.
2025/0110600 A1 4/2025 Asp et al.
2025/0287549 A1 9/2025 Spinazzola et al.

FOREIGN PATENT DOCUMENTS

CN 113677167 B 11/2021
CN 218570721 U 3/2023
CN 221429431 U 7/2024
CN 118434085 A 8/2024
CN 118434087 A 8/2024
EP 3 113 591 A2 1/2017
JP 2017-161111 A 9/2017
JP 6268975 B2 1/2018
WO WO-2019/095070 A1 5/2019
WO WO-2023/212236 A1 11/2023
WO WO-2024/047252 A1 3/2024

OTHER PUBLICATIONS

International Search Report and Written Opinion for PCT Appl. Ser. No. PGT/US2023/020264 dated Oct. 18, 2023 (32 pages).
Australian Office Action on AU Appl. No. 2023259514 dated Oct. 7, 2025 (5 pages).
Notice of Reasons for Refusal on JP Appl. No. 2024-563443 dated May 19, 2026 (6 pages with English language machine translation).
Office Action on CA Appl. No. 3249206 dated Apr. 21, 2026 (4 pages).

* cited by examiner

1150
Delta P In. W. G.
1143 RPM
950 RPM
800 RPM
650 RPM
500 RPM
Predicted Values
Volumetric Flow Rate (CFM)

1160

Delta P In. W. G.
Bypass = 0
Bypass = 0
Bypass = 0
Bypass = 0
Bypass = 0
Bypass = 0
Bypass = 0
Bypass = 0
Bypass = 0
Bypass = 0
Predicted Values
Volumetric Flow Rate (CFM)
1170
CV
Bypass Durung Evap - Fan Cost: $959.9719, Water Cost: $85.0186, Total Cost: $1044.9905

Dollars 0.8 0.6 0.4 0.2 0

Fan Cost
Water Cost
Total Cost

May 01 May 04 May 07 May 10 May 13

During Evap - Fan Cost: $12208.4661, Water Cost: $9634.484, Total Cost: $21842.9502

Dollars 1 0.8 0.6 0.4 0.2 0

Fan Cost
Water Cost
Total Cost

Apr 2020 Jul 2020 Oct 2020 Jan 2021

DIRECT EVAPORATIVE COOLING SYSTEM FOR DATA CENTER WITH FAULT DETECTION

CROSS-REFERENCE TO RELATED APPLICATIONS

This application claims the benefit of and priority to U.S. Provisional Application No. 63/336,240 filed Apr. 28, 2022, U.S. Provisional Application No. 63/403,016 filed Sep. 1, 2022, and U.S. Provisional Application No. 63/403,018 filed Sep. 1, 2022, the entire disclosures of which are incorporated by reference herein.

BACKGROUND

The present disclosure relates generally to direct evaporative cooling, for example direct evaporative cooling of data centers. A data center can be a building, facility, etc. including computing hardware (e.g., servers, computer processing units, hard drives, etc.). Computing hardware typically generates heat during operation, for example due to electrical resistance within such computing hardware. Further, computing hardware may need to be kept in an appropriate temperature range in order to properly function. Accordingly, a need exists to remove heat from data centers (i.e., to cool data centers).

One approach for cooling a data center can be direct evaporative cooling. Direct evaporative cooling uses evaporation of water to create a cooling effect which can be used to affect temperature of a data center. However, direct evaporative cooling consumes both water and energy, both or either of which may be scarce and/or valuable resources in certain geographic regions. Accordingly, technologies which can reduce resource consumption of direct evaporative cooling units for data centers and/or detect faults in direct evaporative cooling units for data centers would be valuable.

SUMMARY

One implementation of the present disclosure is a method for fault detection for direct evaporative cooling of a data center. Direct evaporative cooling affects a humidity and a temperature of the data center. The method includes generating expected values for the humidity of the data center and expected values for the temperature of the data center using a model, and determining a fault condition in response to the actual values for the humidity deviating from the expected values for the humidity while actual values for the temperature track the expected values for the temperature, or determining a fault condition in response to the actual values for the temperature deviating from the expected values for the temperature while actual values for the humidity track the expected values for the humidity.

In some embodiments, the method includes altering control of the direct evaporative cooling of the data center to resolve the fault condition. The model may use inputs including a bypass profile and outdoor air temperature values. In some embodiments, the model is further based on a design efficiency of a direct evaporative cooling unit. In some embodiments, the method includes determining a degradation of the design efficiency based on a comparison of the expected values to the actual values.

Another implementation of the present disclosure is a method for fault detection for a group of direct evaporative cooling units. The method includes detecting one or more of the direct evaporative cooling units as outliers by performing peer analysis on performance of the direct evaporative cooling units, detecting a fault by examining the outliers, determining a source of the fault using analytical methods, and initiating a recommended action for resolving the source of the fault.

In some embodiments, the performance of the direct evaporative cooling units is quantified as efficiencies of the direct evaporative cooling units. In some embodiments, detecting the one or more of the direct evaporative cooling units as outliers by performing the peer analysis comprises using a generalized extreme studentized deviate. In some embodiments, determining the source of the fault using analytical methods also includes performing a model-based calculation. In some embodiments, the recommended action includes one or more of mechanical maintenance, cleaning, replacement of a sensor, replacement of evaporative media, or replacement of an air filter.

Another implementation of the present disclosure is a method of controlling a direct evaporative cooling unit. The method includes predicting water consumption and energy consumption of the direct evaporative cooling unit based on possible supply air temperatures of the direct evaporative cooling unit, selecting a target supply air temperature based on an optimization of an objective function, the objective function comprising the water consumption and energy consumption, and controlling the direct evaporative cooling unit in accordance with the target supply air temperature.

In some embodiments, the water consumption includes at least one of water that evaporates during operation of the direct evaporative cooling unit or water drained from a water tank of the direct evaporative cooling unit. In some embodiments, predicting the water consumption is based on an amount of airflow over an evaporation media of the direct evaporative cooling unit and an expected change in humidity of the airflow across the evaporation media. In some embodiments, the energy consumption comprises energy consumption of a fan of the direct evaporative cooling unit.

In some embodiments, the supply air temperatures of the direct evaporative cooling unit are associated with bypass damper positions as a function of outside air temperature. Predicting the energy consumption may be based on the bypass damper positions. Controlling the direct evaporative cooling unit in accordance with the target supply air temperature may include controlling a bypass damper to a position determined based on the target supply air temperature and an outdoor air temperature.

In some embodiments, predicting the water consumption and the energy consumption of the direct evaporative cooling unit based on possible supply air temperatures of the direct evaporative cooling unit includes utilizing a plurality of curves representing relationships between pressure differential and flow rate for a plurality of bypass damper positions.

Another implementation of the present disclosure is a method of controlling a group of direct evaporative cooling units serving a data center. The method includes selecting a target supply air temperature for the group of direct evaporative cooling units by performing a first optimization of an objective based on predicted water and energy consumption of the group of direct evaporative cooling units, distributing the predicted water and energy consumption among the group of direct evaporative cooling units by performing a second optimization constrained by the target supply air temperature, controlling the group of direct evaporative cooling units in accordance with a result of the distributing.

Another implementation of the present disclosure is a method for fault detection for direct evaporative cooling of a data center. Direct evaporative cooling affects a humidity and a temperature of the data center. The method includes generating expected values for the humidity of the data center and expected values for the temperature of the data center using a model and triggering a sensor fault in response to measured values for the humidity deviating from the expected values for the humidity while measured values for the temperature track the expected values for the temperature or measured values for the temperature deviating from the expected values for the temperature while measured values for the humidity track the expected values for the humidity.

In some embodiments, the method also includes executing an action to resolve the sensor fault in response to triggering the sensor fault. Executing the action to resolve the sensor fault can include moving a sensor, cleaning the sensor, or replacing the sensor. Executing the action to resolve the fault can include altering control of the direct evaporative cooling of the data center to adapt to the fault condition.

In some embodiments, the model uses inputs comprising a bypass profile and outdoor air temperature values. The model may be further based on a design efficiency of a direct evaporative cooling unit. In some embodiments, the method includes determining a degradation of the design efficiency based on a comparison of the expected values to the actual value.

Another implementation of the present disclosure is a method for sensor fault detection for a first sensor that measures a first condition and a second sensor that measures a second condition. Equipment is operable to affect the first condition and the second condition. The method includes generating expected values for the first condition and corresponding expected values for the second condition using a physics-based model that defines a physics-based relationship between the first condition and the second condition, triggering a sensor fault in response to determining that measured values for the first condition deviate from the expected values for the first condition and measured values for the second condition track the expected values for the second condition, and abstaining from triggering the sensor fault in response to determining that measured values for the first condition deviate from the expected values for the first condition and measured values for the second condition deviate from the expected values for the second condition.

In some embodiments, the method also includes executing an action to resolve the sensor fault in response to indicating the sensor fault. Executing the action to resolve the sensor fault can include moving the first sensor or the second sensor, cleaning the first sensor or the second sensor, and/or replacing the first sensor or the second sensor. In some embodiments, the method includes altering control of direct evaporative cooling of a data center to adapt to the fault condition.

In some embodiments, the physics-based model uses a bypass position of a direct evaporative cooling unit as input. The physics-based model may be based on an efficiency of a direct evaporative cooling unit. In some embodiments, the first sensor measures a supply air humidity of a direct evaporative cooling unit and the second sensor measures a supply air temperature of a direct evaporative cooling unit.

In some embodiments, the method includes controlling the direct evaporative cooling unit by determining a target supply air temperature that minimizes an objective function accounting for water consumption of the direct evaporative cooling unit.

Another implementation of the present disclosure is a method for sensor fault detection for a first sensor that measures a first indoor air condition and a second sensor that measures a second indoor air condition. The method includes determining an expected relationship between the first indoor air condition and the second indoor air condition based on thermodynamic principles, evaluating first measurements of the first indoor air condition from the first sensor and second measurements of the second indoor air condition from the second sensor to determine whether the first and second measurements satisfy the expected relationship between the first indoor air condition and the second indoor air condition, and triggering a fault in the first sensor or the second sensor in response to determining that the first measurements from the first sensor and the second measurements from the second sensor do not satisfy the expected relationship between the first indoor air condition and the second indoor air condition.

In some embodiments, the first sensor and the second sensor are associated with a first unit of a plurality of equipment units. The method may also include attributing the fault to the first sensor or the second sensor by performing peer analysis for the plurality of equipment units. Performing the peer analysis can include determining whether the measurements from the first sensor or the measurements from the second sensor are outliers. In some embodiments, performing the peer analysis includes using a generalized extreme studentized deviate.

In some embodiments, the method includes performing, in response to the fault, one or more of cleaning, moving, or replacing the first sensor or the second sensor.

BRIEF DESCRIPTION OF THE FIGURES

The disclosure will become more fully understood from the following detailed description, taken in conjunction with the accompanying figures, wherein like reference numerals refer to like elements, in which.

DETAILED DESCRIPTION

Figure 1:
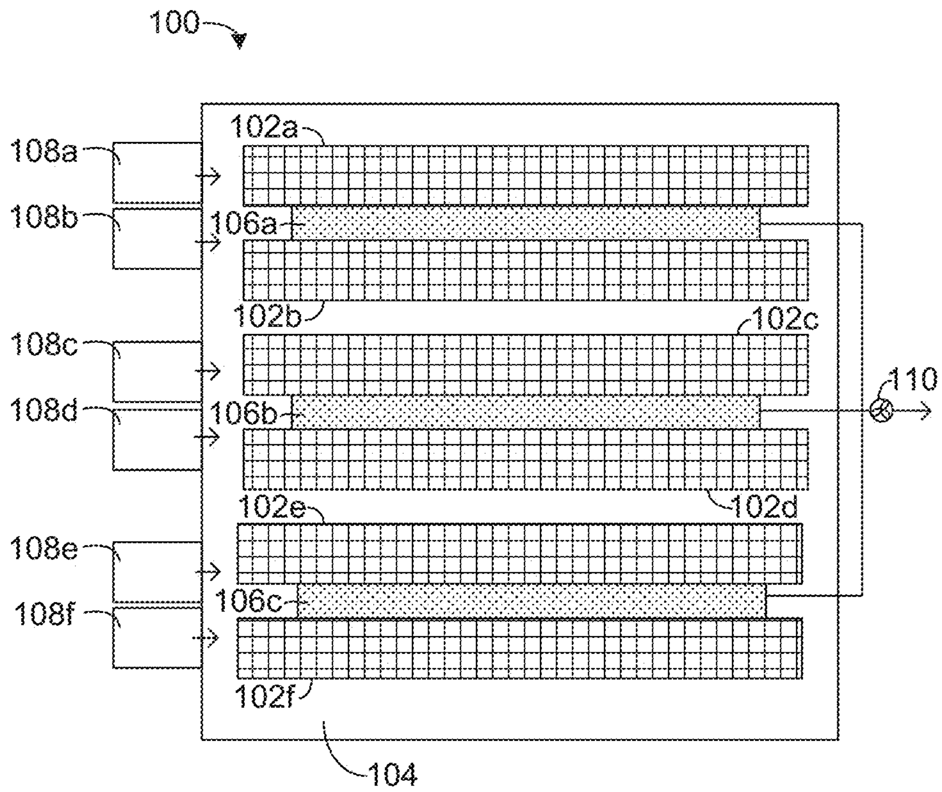
FIG. 1 is a block diagram of a data center, according to some embodiments.

Referring generally to the figures, the teachings of can be applied with various direct evaporative cooling systems, for example applied using computer room air conditioning systems as described in U.S. Pat. No. 9,635,786 (granted Apr. 25, 2017) & U.S. Pat. No. 9,521,783 (granted Dec. 13, 2016) and/or U.S. application Ser. No. 17/482,181, 18/071,336, or 18/071,327, the entire disclosures of which are incorporated by reference herein. A direct evaporative cooling (DEC) unit (DEC system) uses an evaporative media, a tank, and a pump which circulates fluid through the pump. A supply fan operates to blow air across the evaporative media, creating evaporation of the fluid provided from the tank. In some embodiments, the pump is operated to push enough fluid through the tank to pull salt or other impurities from the fluid back into the tank (rather than leaving such salt at the evaporative media as fluid evaporates). Although salt is described as the primary example of a substance which can be present in the fluid, it is contemplated that the fluid can contain any number or type of impurities (e.g., dissolved salts or minerals, particulate matter, other fluids which do not evaporate within the evaporative media, etc.) which may increase in concentration as the fluid evaporates. While salt is described throughout the present disclosure for ease of explanation, the same or similar control strategies can be used to handle other impurities in the fluid.

The tank is filled at an initial time, and fluid level decreases as evaporation occurs to provide cooling. Salt concentration will increase as the fluid is evaporated. Once the salt reaches a threshold level in the tank (e.g., measured by a sensor), the tank drained. Also, at fixed intervals, the tank is fully flushed (e.g., for cleaning and sanitation purposes). In some embodiments herein, a controller is programed to perform a water usage control process, for example a water usage optimization. One goal of the control process is to manage salt concentration increase in the tank to coordinate the duration over which salt builds to a threshold limit and the fixed interface for flushing the tank, thereby reducing an overall number of tank flushes (e.g., by preventing salt concentration from reaching a threshold until the preset flush time). Executing such control can include using a penalty function or constraints based on such terms to make on/off decisions for the DEC system.

In some embodiments, control circuitry can also be programed to provide fan power optimization. Fans on severs/computers/CPUs/etc. in a data room may be controlling to an exhaust temperature coming out of the CPU (measured by a sensor), such that the fans will speed up with supply temperature increase or with CPU power usage increase. As the CPU fans speed up, a vacuum builds up behind them, so a supply fan of the cooling (e.g. DEC) system has control of static pressure before the CPUs (e.g., feedback control with a pressure sensor). Supply fan is indirectly controlled by the CPU fans.

Because supply air temperature to the CPUs thus affects the necessary fan speed, and because fans have cubic relationship of power to flow, at some point, based on cost of water, power, OAT, fan model, it may be more efficient to turn on the evaporative cooling to lower the supply temperature rather than running all the fans harder. A bypass damper can be controlled to make such a transition (e.g., from free cooling and/or ventilation of outdoor air to cooling of air with the DEC system). At some point, 100% of supply air will go through the evaporation media at which point the control circuitry can then again increase the fan speed. An optimization process or other control decision process can be executed to make control decisions for the equipment (fan speeds, DEC on/off or other setpoints, damper position, etc.) which are then executed to improve overall efficiency.

Additionally, control circuitry can be programmed to execute control processes to reduce an overall consumption of water by the DEC system and fan power consumption (and, in some embodiments, power consumption of other components of the DEC system (e.g., pump, etc.) by coordinating the operation of all such systems in an energy efficient manner. Coordinating water consumption and fan power consumption can include building models and performing operations to select supply air temperatures to be provided by the DEC system overtime which result in minimization of an objective function that accounts for both water consumption and fan power consumption. The supply air temperature values can then be used to control the DEC system, for example by controlling an actuator to affect a bypass damper position.

In some embodiments herein, a controller is enabled to detect faults of a DEC unit by comparing expected temperature and humidity values determined by a model to measured values. Based on certain discrepancies, a fault can be detected. In some embodiments, a fault can be automatically compensated for, for example by adding an offset to sensor readings in response to detecting that a faulty sensor is providing values which are offset from the actual values.

Such features improve operations of DEC units and improve cooling of data centers, for example by reducing resource usage in cooling data centers. The controller(s), control circuitry, etc. herein may be provided in a cloud-based system, in an on- or off-site server, in the CPUs/servers/etc. cooled by the equipment being controlled, locally on the equipment (e.g., on an edge device), etc. and/or some combination thereof in various embodiments.

The features herein may be used in addition to, in coordination with, or otherwise complement features described in U.S. patent application Ser. No. 16/579,686, filed Sep. 23, 2019, the entire disclosure of which is incorporated by reference herein.

Referring now to FIG. 1, a diagram of a data center 100 is shown, according to some embodiments. The data center 100 includes multiple server racks, shown as server racks 102*a*, 102*b*, 102*c*, 102*d*, 102*e*, and 102*f* arranged parallel to one another. The server racks are positioned with a cold space 104 that provides cold aisles around or between the server racks 102*a*. Hot aisles 106*a*, 106*b*, and 106*c* are positioned between pairs of server racks (with hot aisle 106*a* between server racks 102*a* and 102*b*, hot aisle 106*b* between server racks 102*c* and 102*d*, and hot aisle 106*c* between server racks 102*e* and 1020. The hot aisles 106*a*, 106*b*, 106*c* are sealed from the cooled space 104 except for air that may flow through the server racks 102*a-f*. An exhaust fan 110 runs to draw hot air out of the hot aisles 106*a*, 106*b*, 106*c*. Multiple direct evaporative cooling units 108*a*, 108*b*, 108*c*, 108*d*, 108*e*, 108*f* are included and provide air (e.g., cooled air) into the cold space 104.

The servers racks 102*a-f* hold various servers, processors, hard drives, routers, and other computing hardware which generate heat in operation (e.g., due to electrical resistance therein). The server racks 102*a-f* can include fans which draw relatively cold air from the cold space 104, across the computing hardware, and into the hot aisles 106*a*, 106*b*, 106*c*. Air flow can also be driven by pressure differentials across the server racks 102*a-f*, for example created by operation of exhaust fan 110. The air reaching the hot aisles 106*a*, 106*b*, 106*c* is therefore heated by the server racks, such that the hot aisles 106*a*, 106*b*, 106*c* have an air temperature greater than an air temperature of the cool space 104. The direct evaporative cooling units 108*a*, 108*b*, 108*c*, 108*d*, 108*e*, 108*f* operate to provide air into the cool space 104, including air cooled by direct evaporative cooling. The server racks 102*a-f* are thereby cooled, for example such that the server racks 102*a-f* are maintained within a target temperature range.

Figure 2:
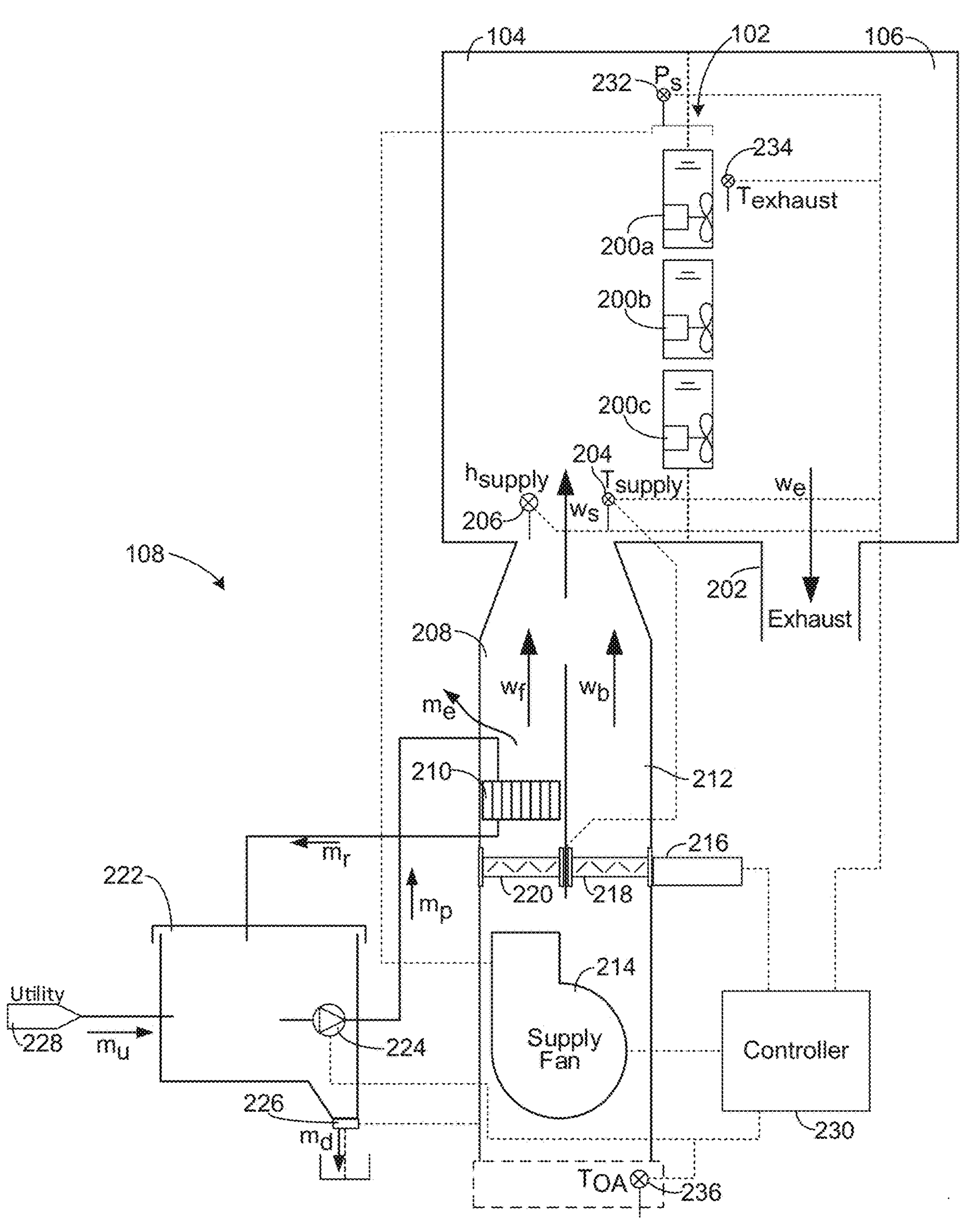
FIG. 2 is a diagram of a direct evaporative cooling (DEC) unit, according to some embodiments.

Referring now to FIG. 2, a block diagram of a DEC unit 108 serving a server rack 102 is shown, according to some embodiments. The DEC unit 108 may be any one of the DEC units 108*a-f* of FIG. 1 and the server rack 102 can be any one of the server racks 102*a-f* of FIG. 1, in some embodiments. FIG. 1 shows the server rack 102 separating cold space 104 and hot space 106, where the hot space 106 may be one of the hot aisles 106*a-c* of FIG. 1, in some embodiments. In other embodiments, the DEC unit 108 serves a single server rack 102 in a data center (e.g., modular computing room) having cold space 104 and a hot space 106 separated by the server rack 102. As shown, the server rack 102 can include multiple CPU fans 200*a*, 200*b*, 200*c* operable to force air from the cold space 104 to the hot space 106, where it can leave the hot space 106 as exhaust. In some embodiments, a fan is additionally or alternatively included at an exhaust port 202 of the hot space 106 to force air from the hot space 106 to an exterior of the data room (i.e., into the external environment).

The DEC unit 108 operates to provide air into the cold space 104. The air delivered into the cold space 104 by the DEC unit 104 referred to as supply air. As illustrated, the DEC unit 108 provides supply air at a flow rate of $w_s$ to the cold space 104 having a supply air temperature $T_{supply}$ (which can be measured by temperature sensor 204) and a supply air humidity (which can be measured by humidity sensor 206). The supply air is a combination of airflow through a face channel 208 in which evaporation media 210 is positioned and a bypass channel 212 which is open to airflow and allows air to bypass the evaporation media 210. The supply air flow rate Iv, can be found as the sum of the flow rate through the face channel 208 ($w_f$) and the flow rate through the bypass channel 212 ($w_b$) (i.e., $w_s = w_f + w_b$).

The DEC unit 102 includes a supply fan 214 operable to force air into the face channel 208 and the bypass channel 212, with one or more dampers included to direct the air flow from the supply fan 214 into the face channel 208, the bypass channel 212, or some combination thereof. As shown, the DEC unit 102 includes an actuator 216 operable to reposition a bypass damper 218 and a face damper 220. The bypass damper 218 and the face damper 220 may mechanically interoperate and may be referred to herein as a single damper (e.g., as bypass damper), for example such that the damper(s) direct air entirely through the bypass channel 212 at a maximum damper position, entirely through the face channel 208 at a minimum damper position, and partially through both the bypass channel 212 and the face channel 208 at different proportions through the range of damper positions between the minimum and maximum positions. In some embodiments, the bypass damper 218 and the face damper 220 are independently controllable and can be set to any position (e.g., fully open, fully closed, 20% open, 40% open, 75% open, etc.) independently of each other. The actuator 216 is thereby controllable to cause different amounts of the airflow provided by the supply fan 214 to flow through the face channel 208 and the bypass channel 212 at different times, e.g., to implement control strategies as described below. The power consumed by the supply fan 214 to provide an amount of airflow can depend on the damper position, due to different resistance to airflow in the face channel 208 as compared to the bypass channel 212.

Airflow through the face channel 208 passes across evaporation media 210 where water evaporates from the evaporation media 210 into the airflow. The DEC unit 102 includes a water tank 222 configured to hold water and a water pump 224 configured to pump water from the water tank 222 to the evaporation media. In FIG. 1, an amount of water (pumped water mass $m_p$) is pumped to the evaporation media 210 where some of that water (evaporated water mas $m_e$) evaporates into the airflow through the face channel 208 and a remainder of the water (return water mass $m_e$) returns to the tank 222. The tank 222 includes a drain 226 which is controllable to periodically drain the tank 222 (i.e., periodically open so that an amount of water flows out, shown as drained water mass $m_d$), which may be done on a set schedule to ensure water in the tank is sanitary (e.g., prevent algae or bacteria growth, etc.). The tank 222 also receives water from a utility 228 or other water source, with an amount of water received from the utility shown in FIG. 1 as utility water mass $m_u$.

As water evaporates from the evaporation media 210, the evaporating water leaves behind salts that were dissolved in said water. The return water mass $m_e$ can flush the salts back to the tank. Over time, the concentration of dissolved salts in the tank increases due to some of the water evaporating, and eventually may become high enough that the water is no longer suitable for use in the evaporative media 210. The tank 222 may be drained and refilled at that point to provide fresh water for use in evaporative cooling.

The DEC unit 108 is shown as including a controller 230. The controller 230 can include circuitry configured to (e.g., programmed to) perform the operations described herein relating to control of the DEC unit 108 and, in some embodiments, control of the CPU fans 200*a-c* and/or operations of computing hardware of the server rack 102. The controller 230 can also or alternatively provide fault detection for the DEC unit 108. In some embodiments, the controller 230 includes one or more processors and non-transitory computer-readable media storing program instructions that, when executed by the one or more processors, causes the one or more processors to perform the operations attributed herein to the controller 230. The controller 230 may be included locally as part of the DEC unit 108 (e.g., packaged with, coupled to, etc. the DEC unit 108), provided on computing hardware of the server rack 102, provided remote from the DEC unit 108, and/or some combination thereof in various embodiments. As shown in FIG. 2, the controller 230 can be communicable with the supply fan 214, the actuator 216, the water pump 224, the drain 226, the temperature sensor 204, the humidity sensor 206, and other sensors (shown as a pressure sensor 232 measuring a pressure differential across the server rack 102, and a temperature sensor 234 positioned in the hot space 106 and measuring an exhaust air temperature, and a temperature sensor 236 positioned to measure outdoor air temperature of outdoor air flowing into the DEC unit 108 and the supply fan 214. Although several examples of sensors are shown in FIG. 2, it is contemplated that any number or type of sensors can be present within the DEC unit 108, the server rack 102, the cold space 104, the hot space 106, downstream or upstream of the DEC unit 108, within the tank 222, or located at any other location within the system in various embodiments. The controller 230 can execute the various processes shown in the drawings and described below, including by using the various equations, algorithms, etc. described herein.

In the example of FIGS. 1-2, the cost of cooling a data center can be attributed to three major components: electricity to power the fans, electricity to power the water pump(s), and the cost of water. CPU fans 200*a-c* and the supply fan 214 (and/or exhaust fan 110) are capable of modulating their speed and thus should have a power $P_{fan}$ to flow $w_{fan}$ relationship that follows the fan affinity laws based on fan speed sf an:

$$P_{fan}=as_{fan}^3$$

$$w_{fan}=as_{fan}$$

The fans 200*a-c*, 214 can be controlled by the controller 230 based on the exhaust temperature of the air leaving the server rack 102 (e.g., as measured by sensor 234), in a manner such that the total flow desired by the CPU fans will follow:

$$w_{cpu}=\frac{\dot{Q}_{cpu}}{\rho c_p(T_{sp,e}-\tau_{sp,s})}$$

where $\dot{Q}_{cpu}$ is heat generation of computing equipment at the server rack 102, $T_{sp,e}$ is an exhaust temperature setpoint and $T_{sp,s}$ is a supply temperature setpoint, and ρ, $c_p$ are parameters (e.g., density, heat transfer coefficient). The supply fan 214 produces the flow of the CPU fans 200*a-c* (i.e., $w_{cpu}$) plus any (small) amount of leakage into the hot aisle 106 that occurs under static pressure $P_s$:

$$w_s=w_{cpu}+w_{leak}(P_s)$$

Concentration of salts in the tank 222 ($c_{tank}$) may follow a differential equation, where $c_u$ is the salt concentration in water as received from utility 228:

$$\dot{c}_{tank}=\frac{\dot{m}_u}{\rho V}c_u-\frac{\dot{m}_d}{\rho V}c_{tank}$$

Prior to reaching the concentration limit, in some embodiments, no water is drained from the tank 222 and the concentration will integrate as new water from the utility 228 replaces what is lost to evaporation:

$$c_{tank}=c_u+\frac{1}{\rho V}\left(\int_{\tau=0}^{t}\dot{m}_u d\tau\right)c_u$$

The tank will reach the concentration limit when:

$$\frac{(c_{limit}-c_u)}{c_u}=\frac{1}{m_{tank}}\left(\int_{\tau=0}^{t}\dot{m}_e d\tau\right)$$

or once enough water has been evaporated to replace the tank $(c_{limit}-c_u)/c_u$ times. If the DEC unit 108 has not done enough cooling to replace the water the critical amount of times by the time it must be drained for sanitary purposes, then water is wasted. Once the concentration reaches the limit in the tank 222, the drain 226 will be opened to maintain the tank concentration at a steady-state. The water from utility 228 must make up for the drain water and the evaporated water:

$$0=\frac{\dot{m}_u}{\rho V}c_u-\frac{\dot{m}_d}{\rho V}c_{tank}$$

$$0=\frac{\dot{m}_e+\dot{m}_d}{\rho V}c_u-\frac{\dot{m}_d}{\rho V}c_{limit}$$

$$\dot{m}_d=\frac{c_u}{(c_{limit}-c_u)}\dot{m}_e$$

Thus, water is drained proportional to the amount of evaporation and the proportion is dependent on the concentrations in the same way that the number of tank replacements is dependent on the concentrations before the drain is opened. The total water evaporated will be governed by the difference between the supply temperature and the outdoor air temperature:

$$\dot{m}eh_{evap}=P_{air}c_p w_s(T_{oa}-T_s)$$

Accordingly, the water is used for two different reasons. The first reason is to be evaporated and produce the cooling. The second is to dilute the salts that are left behind when the water is evaporated, which includes an upfront purchase to fill the tank 222 before cooling can occur. The control processes described herein can include optimally using that water so that its full value is used for cooling before the tank 222 is drained.

In some embodiments, the controller 230 is programmed to determine, at a given point in time, whether to increase cooling by increasing fan speed or to increase cooling by using water in evaporative cooling. For example, at any particular instant in time, the controller 230 may determine the fan energy given that the air is at the outdoor temperature (e.g., measured by sensor 236) and the fan energy given the temperature achievable by evaporative cooling (e.g., from design values of the equipment). The controller 230 may using logic indicating that the point at which it makes sense to turn on the evaporative cooling occurs when the marginal cost increase from the fan power is equal to the marginal cost increase from the water and electricity used by the evaporative cooling system:

$$\frac{\partial C_{fan}}{\partial\dot{Q}}=\frac{\partial C_{evap}}{\partial\dot{Q}}$$

This turning point occurs under conditions which depends largely on the pricing structure of electricity and water and also on the outdoor air conditions, which can be considered by the controller 230. Adjustments can be made by the controller 230 to enable such logic to account for an inability to run the evaporative cooling at very small loads. Given the trade-offs here, the controller 230 may first run the supply fan 314 at increasing speeds, then as the load gets higher the evaporative cooling (i.e., use of water and face channel 208) will be turned on in order to reduce the supply air temperature. When it is no longer possible to reach the desired supply air temperature using evaporative cooling at the current fan speed, the controller 230 can increase the fan speed, thereby providing more outside air as well as increasing the amount of ventilation that is performed. In some embodiments, the controller 230 uses neural networks, reinforcement learning, or other forms of machine learning to determine when to turn on the evaporative cooling relative running the fan faster. Furthermore, once evaporative cooling is in use, extremum seeking control could be used in order to find the supply air temperature that minimizes the total cost without being subject to any modeling error.

Figure 3:
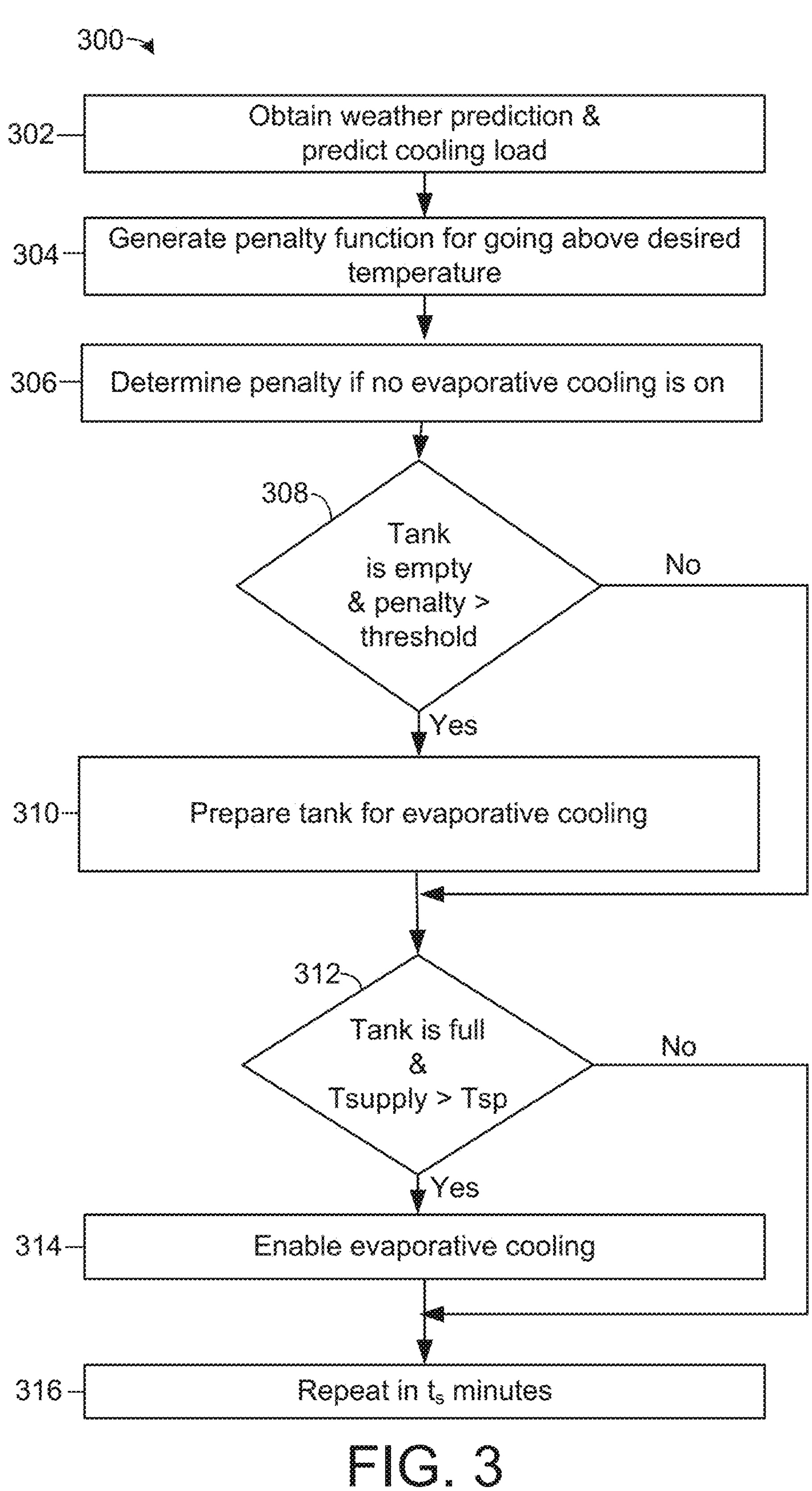
FIG. 3 is a flowchart of a process for controlling a DEC unit, according to some embodiments.

Referring now to FIG. 3, a flowchart of a process 300 for determining whether to use evaporative cooling is shown, according to some embodiments. Process 300 can be executed by the controller 230, for example.

At step 302, a weather prediction is obtained and a cooling load is predicted. The weather prediction can be accessed by the controller 230 from a third-party weather service (e.g., government weather service), for example via the Internet. The weather prediction can indicate outdoor air temperature and/or outdoor air humidity, for example for a next hour, over the next day, etc. The cooling load can be predictive based on the weather prediction and/or based on predictions of the operation of computing equipment of the server rack 102, for example.

At step 304, a penalty function for going above a desired temperature is generated. The desired temperature may be a maximum acceptable temperature for the data center (e.g., based on building operator rules, etc.). The penalty function may be formulated as:

$$C_{penalty} = \left( \int_{t=0}^{h} e\left(\dot{Q}_{req} - \dot{Q}_{evap}, \hat{T}_e - T_{sp}\right) \right)^2,$$

where h is the time horizon, e is a function, $\dot{Q}_{req}-\dot{Q}_{evap}$ is a difference between required heat transfer and heat transfer that can be provided by evaporative cooling, and $\hat{T}e-T_{sp}$ is a difference between expected temperature and a temperature setpoint. At step 306, a penalty is determined if no evaporative cooling is on. The equation above from step 304 can be used.

If the tank 222 has not yet been filled, then the penalty over the horizon (possibly equal to the time prior to the next required tank flush) is compared to a threshold. A small penalty, less than a threshold, means it is not necessary to fill the tank 222, whereas a large penalty would indicate it is necessary to prepare for evaporative cooling by filling the tank 222. Accordingly, at step 308, a determination is made as to whether the tank 222 is empty and the penalty is greater than a threshold. If so ("Yes" at step 308), then at step 310 the tank 222 is filled to prepare for evaporative cooling. If not ("No" at step 308), then the process 300 skips step 310 and proceeds to step 312.

At step 312, a determination is made as to whether the tank 222 is full and whether the supply air temperature $T_{supply}$ is greater than a temperature setpoint $T_{setpoint}$ for the data room. If yes (i.e., the tank 222 is ready for evaporative cooling and the supply air needs to be cooled in order to reach the setpoint), then evaporative cooling is enabled step 314. In step 314, the actuator 216 can operate dampers 218, 220 to direct air through the evaporative media 210 and the water pump 224 can operate to provide water to the evaporative media 210, such that airflow from the supply fan 214 is cooled by direct evaporative cooling in the face channel 208.

If "no" at step 312 (i.e., the tank is not full or $T_{supply}$, is not greater than a temperature setpoint $T_{setpoint}$), direct evaporative cooling is not enabled and the process proceeds to step 316. Step 316 indicates that process 300 can be repeated in is which indicates an amount of time between repetitions of the process 300 (e.g., a number of minutes). The value of is can be user-selected, for example.

The process 300 of FIG. 3 can thereby determine when to use or not use evaporative cooling in an advanced manner that can facilitate water savings.

Figure 4:
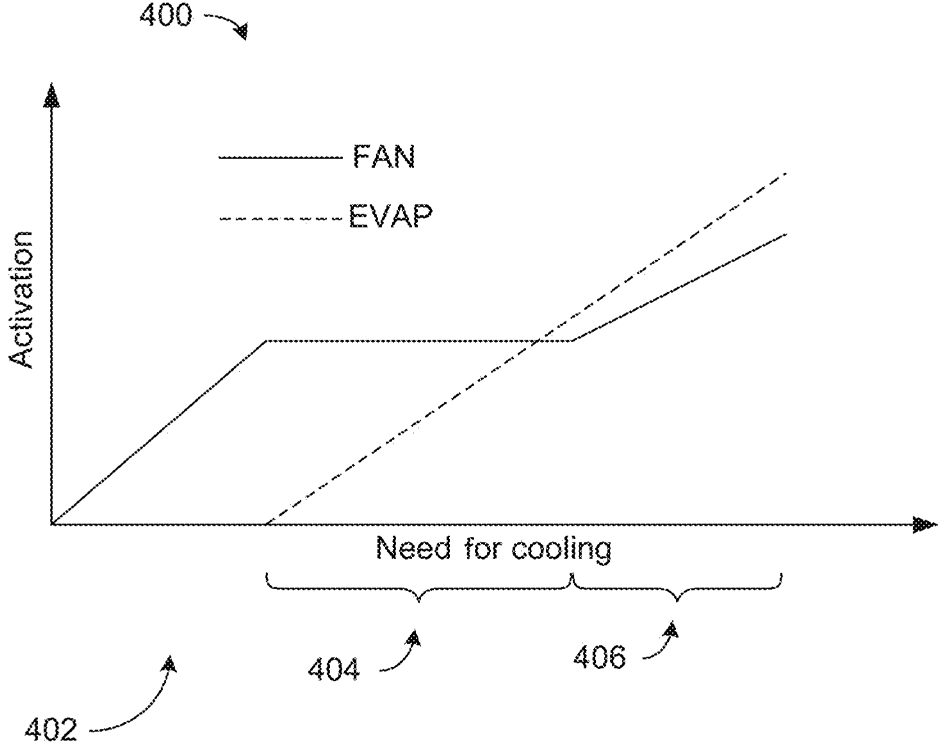
FIG. 4 is a graph illustrating a control approach for a DEC unit, according to some embodiments.

Referring now to FIG. 4, a graphical representation illustrating a control approach that can be executed by the controller 230 is shown, according to some embodiments. FIG. 4 shows a graph 400 illustrating running of the supply fan 214 and the evaporative cooling (e.g., by running of pump 224) across a range of cooling needs (demand, load). Graph 400 illustrates that the fan is operated first without evaporative cooling in a first zone 402. Then, in a second zone 404, evaporative cooling is gradually turned on at constant fan speed (by controlling face damper 220 and bypass damper 218 to gradually direct more air through the evaporation media 210). As cooling demand increases into a third zone 406, both evaporative cooling and fan speed are increased together by increasing the fan speed while directing all airflow across the evaporation media 210.

Figure 5:
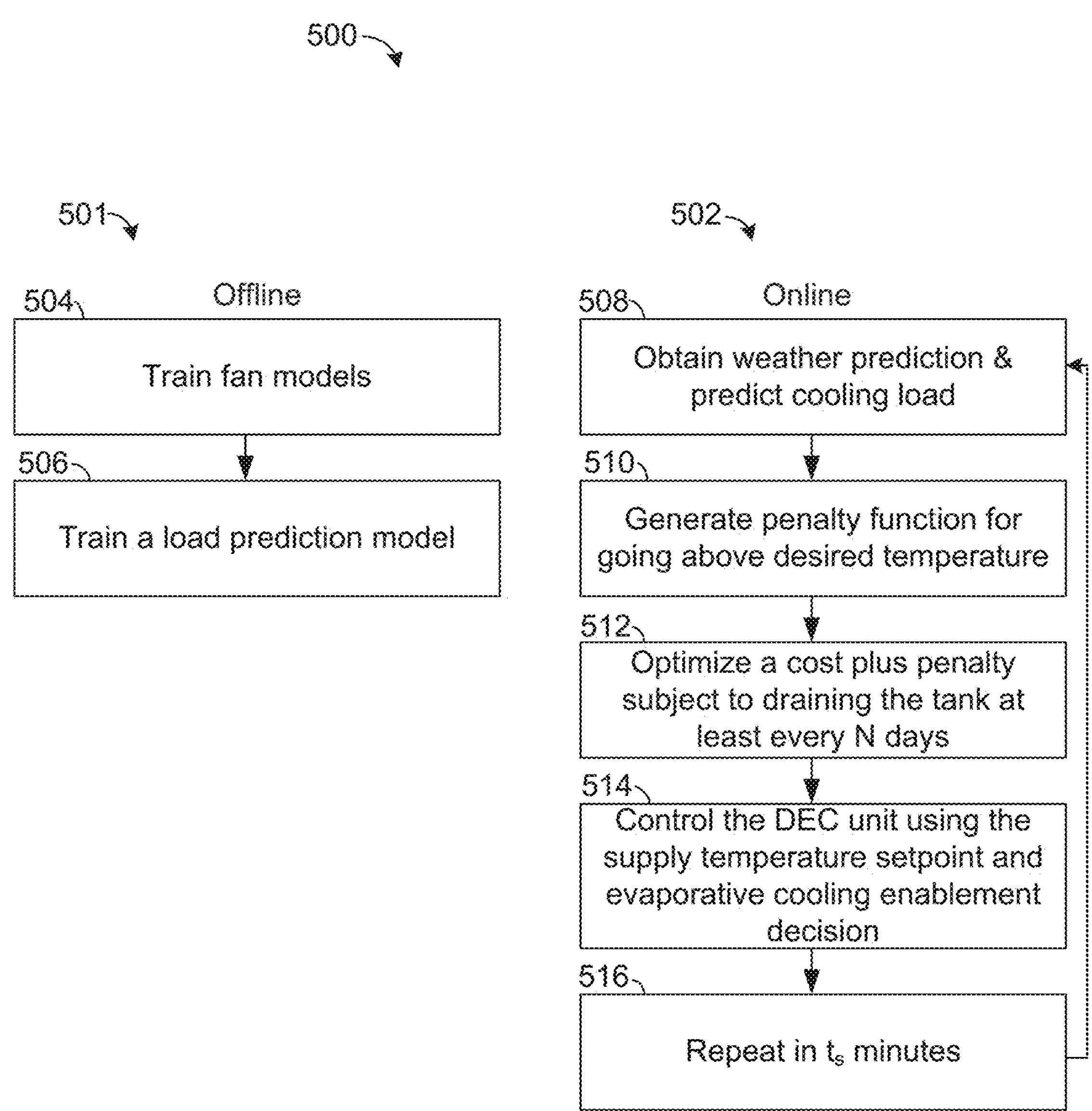
FIG. 5 is a set of flowcharts providing a process for controlling a DEC unit, according to some embodiments.

Referring now to FIG. 5, a pair of flowcharts showing a first part 501 and a second part 502 of a process 500 are shown, according to some embodiments. The process 500 can be executed by the controller 230, in some embodiments. In some embodiments, the first part 501 is executed before the second part 502. The first part 501 can run offline and the second part 502 can run online for controlling the DEC unit 108.

At step 504, fan models are trained. Training the fan models may include identifying the parameter $\alpha$ in the fan equations $P_{fan}=as_{fan}^3$ and $w_{fan}=as_{fan}$ described above. Training the fan models may include estimating a leak amount and in $w_s=w_{cpu}+w_{leak}(P_s)$ described above. Training the fan models can be performed using measurements of fan power consumption along training data representing other variables (e.g., temperatures, damper positions, airflow measurements, pressure measurements, etc.). Various other equations relating to fan operation are provided below and can be used in step 504.

At step 506, a load prediction model is trained. The load prediction model can predict, based on time of day, day of week, etc. and/or other conditions, the amount of heat expected to be generated by the computing equipment of the server rack 102 (i.e., $\dot{Q}_{cpu}$). The load prediction model can be based on weather predictions, in some embodiments. The load prediction model can be trained from historical temperature data and/or historical airflow data, for example. The first part 501 thereby provides a model that predicts an amount of load on the DEC unit 102 and a model for determining fan power from fan speed and/or from airflow rate, which can be used online in the second part 502 of process 500.

The models resulting from the first part 501 of the process 500 may be formulated as:

$$w_{cpu} = \frac{\dot{Q}_{cpu}}{\rho c_p (T_{sp,e} - T_{sp,s})}$$

$$w_s = w_{cpu} + w_{leak}(P_s)$$

$$p_e = a_1 w_{cpu}^3 + a_2 w_s^3 + a_3 \dot{m}_e$$

where the terms are as defined above and $a_3\dot{m}_e$ represents the power consumed by the pump 224.

At step 508 a weather prediction is obtained (e.g., from a weather service) and a cooling load is predicted. The cooling load can be predicted using the load prediction model trained in step 506. Step 508 can provide values of outside air temperature $T_{OA}$ and computing equipment heat generation $\dot{Q}$cpu, for example.

At step 510, a penalty function is generated for going above a desired temperature, i.e., penalizing temperatures at the server rack 102 which go higher than a desired maximum temperature for the server rack 102. The penalty function may be given by $c_{penalty} = r_{penalty}(T_{exhaust} - T_{sp})$, for example.

At step 512, a cost plus penalty is optimized, subject to draining the tank 222 at least every N days. Step 512 can include considering water usage as follows, where water used for diluting the salts is noted separately from the water used to make of for evaporation using the additional subscript d:

$$\dot{m}_u = \dot{m}_{u,d} + \dot{m}_e;$$

$$\dot{m}_{u,d} = \frac{c_u}{(c_{limit} - c_u)} \dot{m}_e, \text{ after the initial purchase has been used;}$$

Tank must not be in service for more than N days without flushing;

$$\dot{m}_e h_{evap} = \rho_{air} c_p w_s (T_{oa} - T_s).$$

These equations, along with the models found in the first part 501 of process 500, can be used as constraints on an optimization that minimizes an objective function, for example $J(T_{suppy}, \dot{Q}, T_{exhaust}) = \Sigma_{horizon} r_e P_e + r_w m_u + c_{penalty}$. Step 512 can find values of $T_{suppy}$, $\dot{Q}$, and/or $T_{exhaust}$ that minimize the objective function, where $r_e$ is a utility rate (i.e., cost per unit electricity) and $r_w$ is a water price (i.e., a cost per unit water). Step 512 can also include determining whether determined values of $T_{suppy}$, $\dot{Q}$, and/or $T_{exhaust}$ require evaporative cooling to be enabled.

At step 514, the DEC unit 108 is controlled using the supply temperature setpoint and evaporative cooling enablement decision to achieve the DEC operation determined to minimize the objective function. The DEC unit 108 is thereby operated as a culmination of preceding steps of process 500. At step 516, the second part 502 of process 500 can be repeated, for example on a regular schedule (e.g., every 15 minutes), enabling process 500 to account for changes in the load or weather forecast.

In some embodiments, step 514 includes controlling the computing equipment to affect the heat generated thereby, i.e., $\dot{Q}_{cpu}$. For example, the controller 230 may be adapted to cause computer tasks to be shifted to other computing equipment, to other data centers, to other parts of a facility, to other times, etc. Doing so will affect the value of the objective function and can help to minimize overall operational costs, for example. Moving computation may itself incur a cost, which can be compared to savings achieved by the cost function as result of such movement to determine whether moving a computation should be implemented in a particular scenario. Process 500 can thereby provide optimal operations of the DEC unit 102.

Figure 6:
FIG. 6 is a flowchart of a process for controlling one or more DEC units, according to some embodiments.
Figure 6:
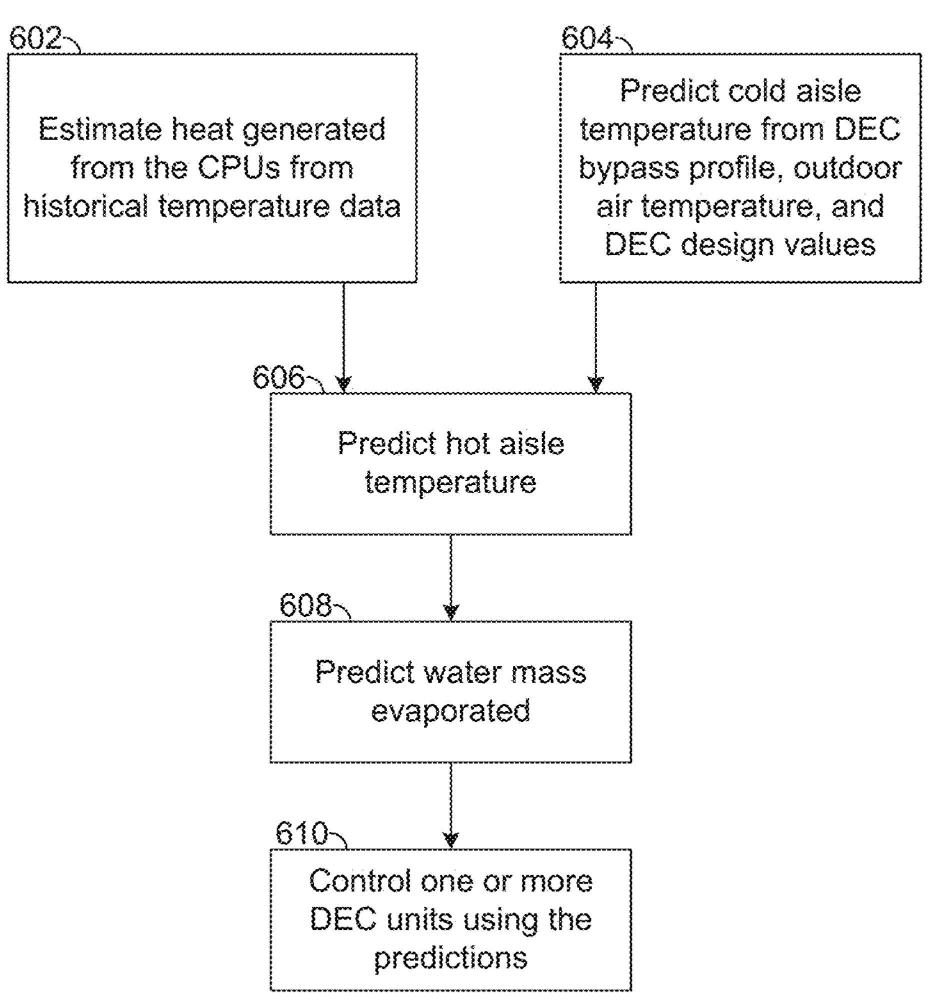

Referring now to FIG. 6, a flowchart of a process 600 for controlling the DEC is shown, according to some embodiments. The process 600 can be executed by the controller 230, in some embodiments. The process 600 can be used in combination with process 500, in some embodiments. The process 600 can result in advantageous operations of the DEC unit 102 as in FIG. 2 and/or the multiple DEC units 102*a-f* of FIG. 1, in various embodiments.

The process 600 can be based on (e.g., use, include algorithm steps derived from, etc.) the following expressions which relate to the efficiency of a DEC unit (e.g., DEC unit 108):

$$\text{Efficiency} = \left(\frac{\text{Dry Bulb } T - DEC \text{ Cooled } T}{\text{Dry Bulb } T - \text{Wet bulb } T}\right)$$

$$DEC \text{ Cooled } T = \text{Dry Bulb } T - \text{Efficiency (Dry Bulb } T - \text{Wet bulb)}$$

$$T_{supply} = \text{ByPass} * T_{oa} + (1 - \text{Bypass}) * DEC \text{ Cooled } T$$

where ByPass indicates the position of the bypass/face dampers (ByPass=1 indicating all air flows through the bypass channel 212, ByPass=0 indicating that all air flows through the face channel 208 and the evaporation media 210. In some embodiments, the efficiency value (denoted as Efficiency) is taken as a known value from design values of the DEC unit (e.g., provided in product literature, indicated by a manufacture), and may be approximately 92% in some embodiments (e.g., between 90% and 95%).

Figure 7A:
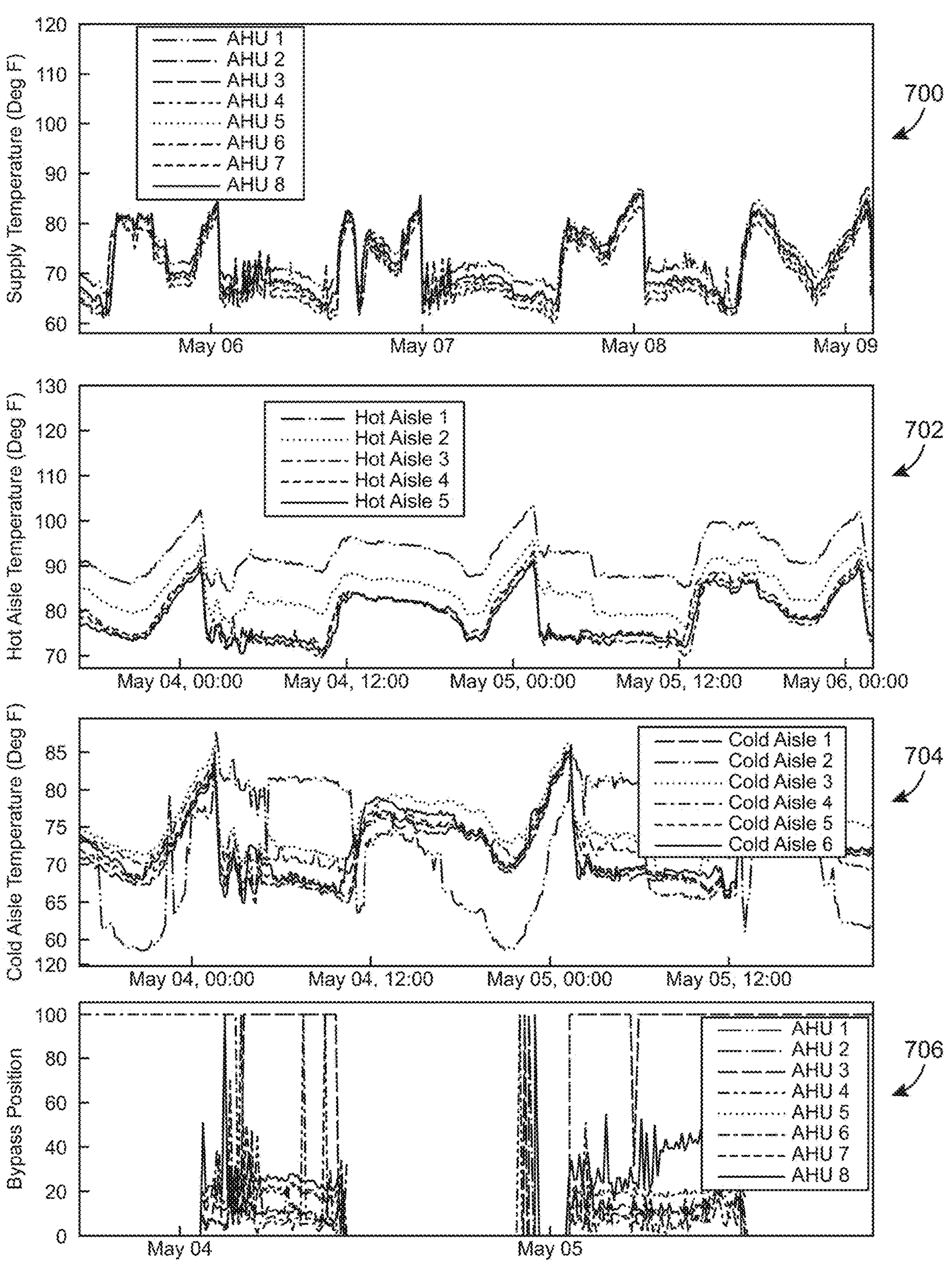
FIG. 7A is a set of graphs illustrating data from an example relating to the process of FIG. 6, according to some embodiments.

At step 602, heat generated from the CPUs (e.g., servers, etc. of the server rack 102) is estimated from historical temperature data. The historical temperature data can include hot aisle temperatures (exhaust temperatures), cold aisle temperatures, and supply temperatures. Bypass values (damper positions) can also be used. As an example for a data center including multiple aisles and DEC units (e.g., similar to FIG. 1), FIG. 7A shows a first graph 700 of supply temperatures from multiple DEC units over a time period (e.g., several days), a second graph 702 of hot aisle temperatures over the same period or a portion thereof, a third graph 704 of cold space (cold aisle) temperatures over the same period a portion thereof, and a fourth graph 706 showing bypass positions over the same period a portion thereof, according to one set of experimental data. In some embodiments, step 602 is performed by taking averages over the multiple DEC units, multiple aisles, etc. In other embodiments, distinct estimations are performed for the multiple models.

Figure 7B:
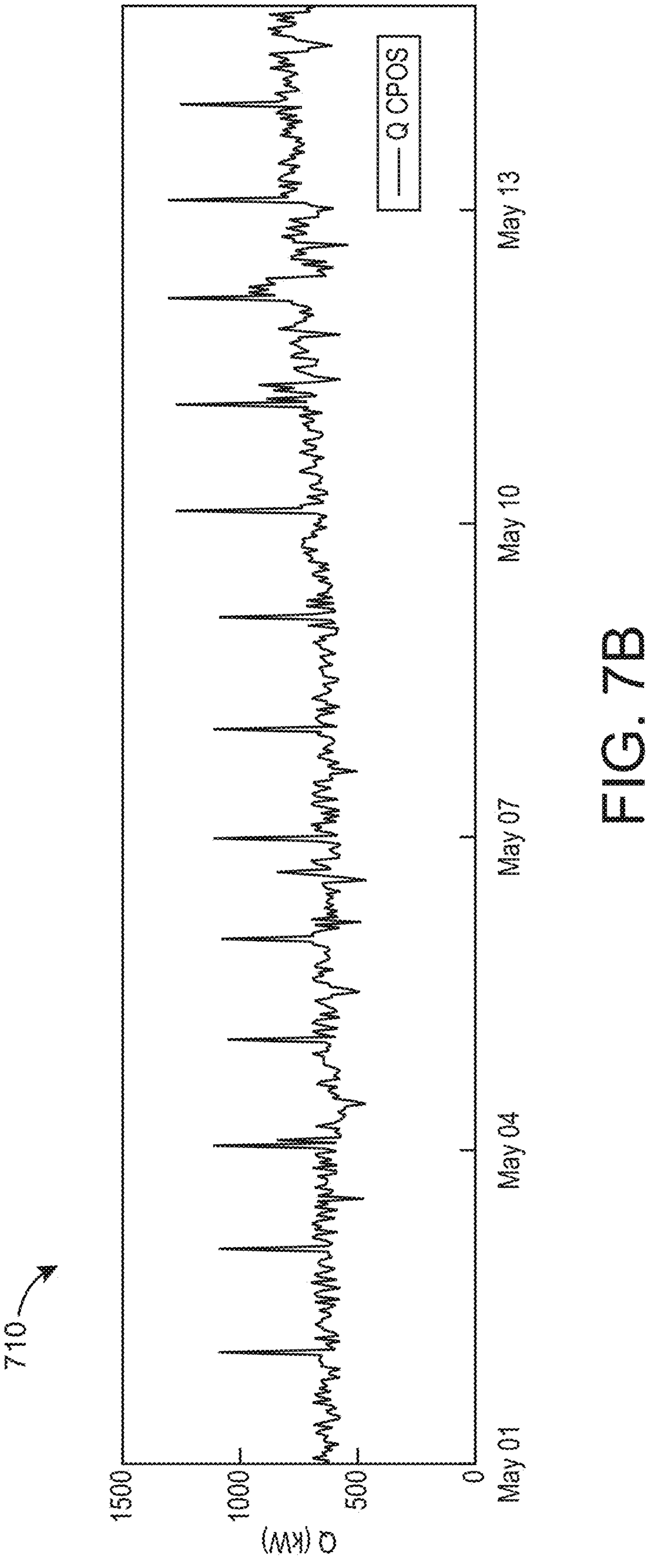
FIG. 7B is a graph illustrating data from an example relating to the process of FIG. 6, according to some embodiments.

Based on the temperature measurements and bypass positions, step 602 can include estimating the heat generated from the CPUs as $Q = \dot{m}C_p(T_{hot} - T_{cold})$, m where is an airflow rate across the CPUs which can be substantially equal to airflow rate provided by one or more supply fans. For example, $\dot{m}$ can be calculated as the summation of fan flow rates for multiple fans serving a data center, for example where a flow rate is found by multiplying a max flow of a fan by a percentage of operating capacity (e.g., percentage fan speed) at which the fan is operated. $T_{hot}$ may be an average of hot aisle temperatures while $T_{cold}$ is an average of cold aisle temperatures or an average of supply air temperatures. FIG. 7B shows a graph 710 illustrating the heat generated from computing equipment in a data center over time, based on temperature data as in the graphs of FIG. 7A. In one example, the estimated Q may have a max of 1300 kW, a mean of 672 kW, for example for a data room with fifteen racks, ten rows, and a design maximum of 10 kW per row.

At step 604, cold aisle temperatures is predicted from DEC bypass profile (bypass positions over time), outdoor air temperature, and DEC design values. In some embodiments, step 604 can be seen as validating the DEC model used by process 600, and involves use of such a model, i.e.:

$$\text{Efficiency} = \left(\frac{\text{Dry Bulb } T - DEC \text{ Cooled } T}{\text{Dry Bulb } T - \text{Wet bulb } T}\right)$$

$$DEC \text{ Cooled } T = \text{Dry Bulb } T - \text{Efficiency (Dry Bulb } T - \text{Wet bulb)}$$

$$T_{supply} = \text{ByPass} * T_{oa} + (1 - \text{Bypass}) * DEC \text{ Cooled } T$$

Figure 8:
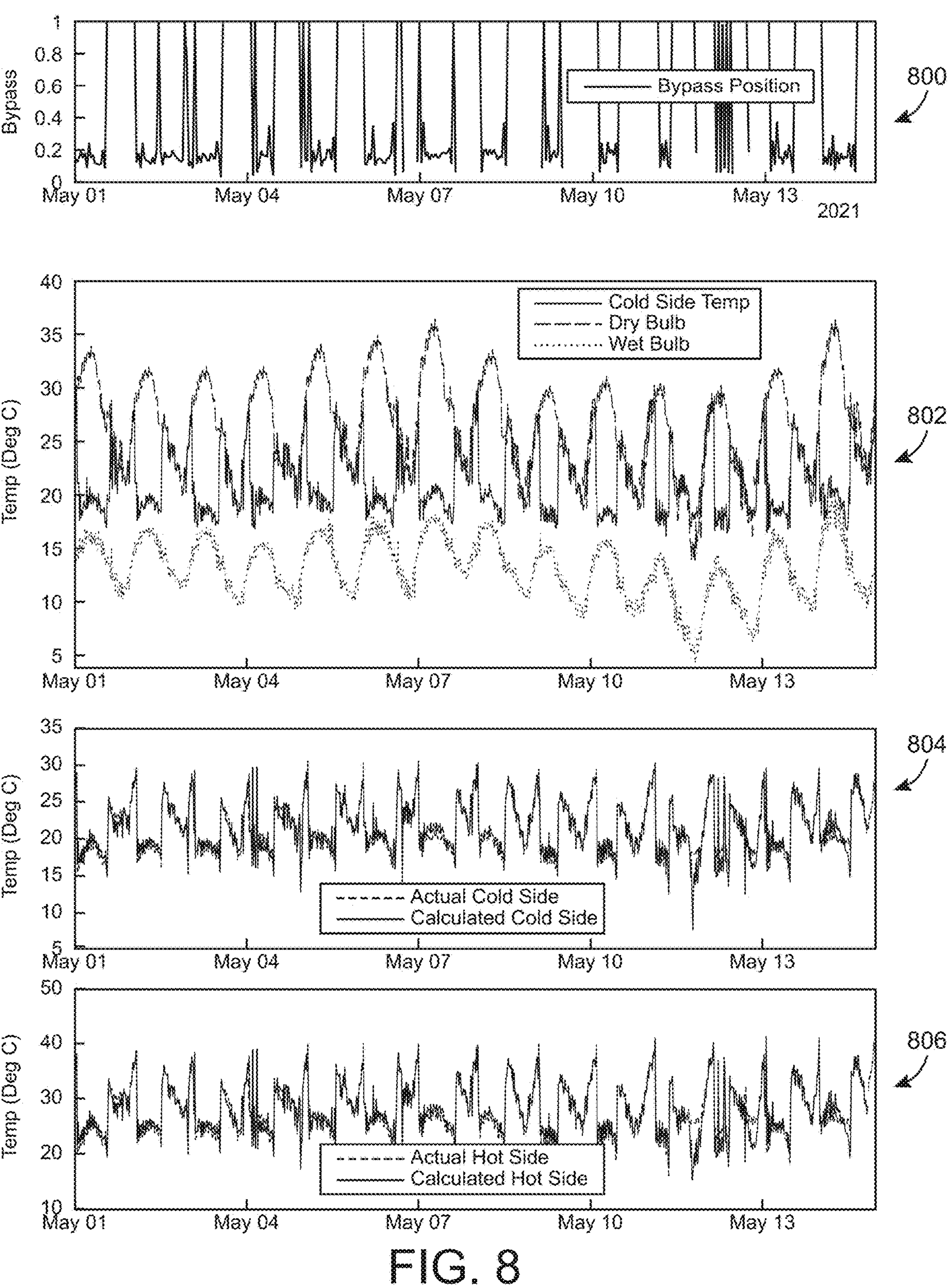
FIG. 8 is a set of graphs illustrating data from an example relating to the process of FIG. 6, according to some embodiments.

By setting the value of the Efficiency from design conditions (e.g., at 92%) and using the average bypass profile from historical data (e.g., the average position of each bypass damper at each time step, from data as shown in graph 706 in FIG. 7A), the cold side (aisle) temperature can be predicted in step 604. FIG. 8 shows an example first graph 800 of the bypass position as used in an example implementation of step 604 and second graph 802 which includes a line plotting predicted/estimated cold aisle temperature over time as derived in step 604. FIG. 8 further includes a third graph 804 illustrating that such calculated cold aisle values track actual cold aisle values, thus validating the approached used by process 600.

At step 606, hot aisle temperature is predicted. Hot aisle temperature can be predicted by using cold aisle temperature predictions from step 604 and CPU heat generation estimations/predictions from step 602, for example. Step 606 can be based on solving $Q=\dot{m}C_p(T_{hot}-T_{cold})$ for $T_{hot}$. The second graph 802 of FIG. 8 includes a line plotting predicted/estimated hot side temperature over time as derived in step 606. FIG. 8 further includes a fourth graph 804 illustrating that such hot aisle values track actual cold aisle values, thus validating the approached used by process 600.

At step 608, an amount of water mass evaporated is predicted. Step 608 can assume that the same efficiency value (i.e., Efficiency) (e.g., 92%) holds for humidity, such that the portion of air that pass across the evaporation media 210 has its humidity increased 92% (or other selected efficiency percentage) of the way between outdoor air humidity and 100% humidity. Step 608 can use that information to perform a water mass balance to calculate the total water evaporated as a function of outdoor air humidity and 100% humidity, as the amount of water evaporated is equal to the amount of water needed to increase the humidity of the air by the known amount.

At step 610, one or more DEC units is controlled using the predictions, e.g., using the temperature predictions and/or the water mass evaporation predictions. In some embodiments, the water mass predictions are used, for example in a manner similar to that described with reference to FIGS. 3-4. For example, step 610 can calculate salt concentration over time using:

$$\dot{c}_{tank} = \frac{\dot{m}_u}{\rho V}c_u - \frac{\dot{m}_d}{\rho V}c_{tank} \text{ and } c_{tank} = c_u + \frac{1}{\rho V}\left(\int_{\tau=0}^{t} \dot{m}_u d\tau\right)c_u,$$

such that the tank will reach a concentration limit when $$\frac{(c_{limit} - c_u)}{c_u} = \frac{1}{m_{tank}}\left(\int_{\tau=0}^{t} \dot{m}_e d\tau\right)$$

where $\dot{m}_e(\tau)$ is predicted in step 608. Step 610 can further use an understanding that purchased water must make up for evaporated and drained water, i.e., $$0 = \frac{\dot{m}_e + \dot{m}_d}{\rho V}c_u - \frac{\dot{m}_d}{\rho V}c_{limit},$$

such that $$\dot{m}_d = \frac{c_u}{(c_{limit} - c_u)}\dot{m}_e.$$

step 610 can use these operations to determine when and how much water to drain and/or purchase from the utility based on the predicted evaporation amount from step 608, for example in order to minimize water consumption over time, and for example subject to constraints on predict temperatures defined using the predicted temperatures form steps 604 and 606.

Step 610 can also include optimally controlling fan speed and/or optimally controlling bypass position, in additional or alternatively to optimally controlling water-related components. Various such features are described elsewhere herein and can be used in step 610 in some embodiments.

Figure 9:
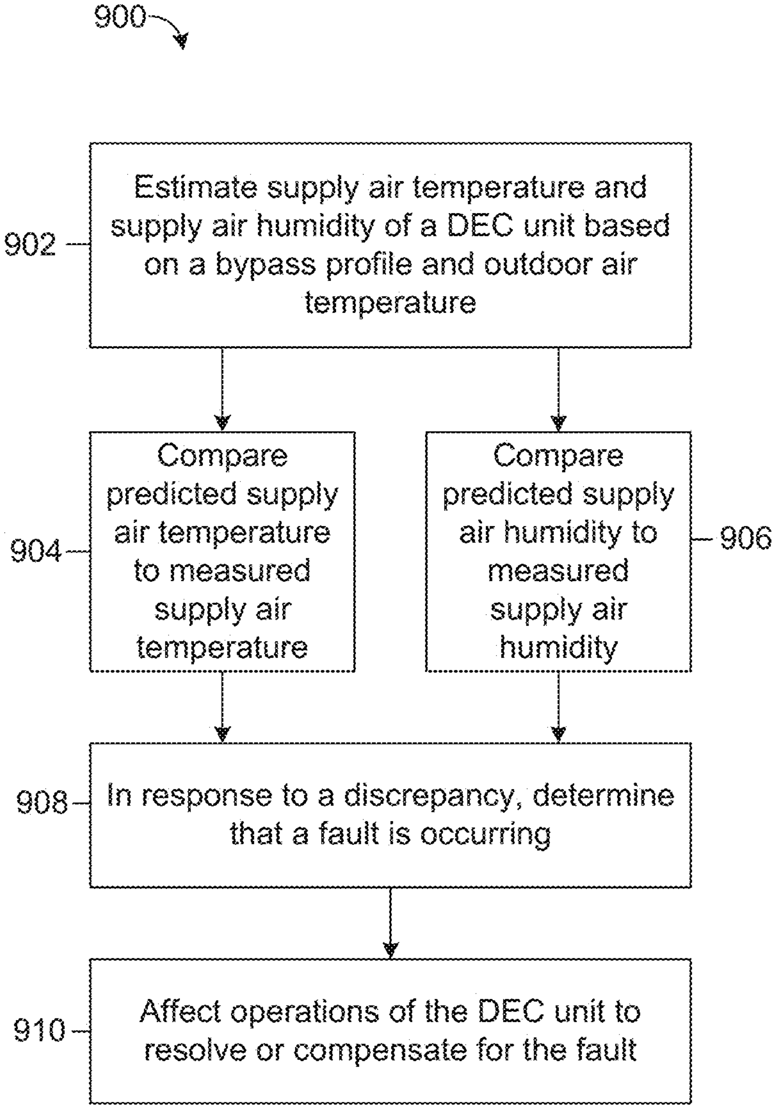
FIG. 9 is a flowchart of a process for model-based fault detection for a DEC unit, according to some embodiments.

Referring now to FIG. 9, a flowchart of a process 900 for model-based fault detection for direct evaporative cooling units is shown, according to some embodiments. In some embodiments, the controller 230 is programmed to execute process 900. Process 900 can use the modeling, equations, etc. of other processes described herein, in various embodiments.

At step 902, supply air temperature and supply air humidity of a DEC unit is estimated (or predicted) based on a bypass profile and an outdoor air temperature. Estimating the supply air temperature and the supply air humidity can include determining expected values of those variables based on actual bypass positions and actual outdoor air temperatures, for example for each time step over a time period. Estimating the supply air temperature and the supply air humidity can be done using the models described elsewhere herein (e.g., with respect to process 600). As in the models used in process 600, the estimations (or predictions) may be based on an ideal design efficiency or other design values from a manufacturer.

Figures 10A, 10B:
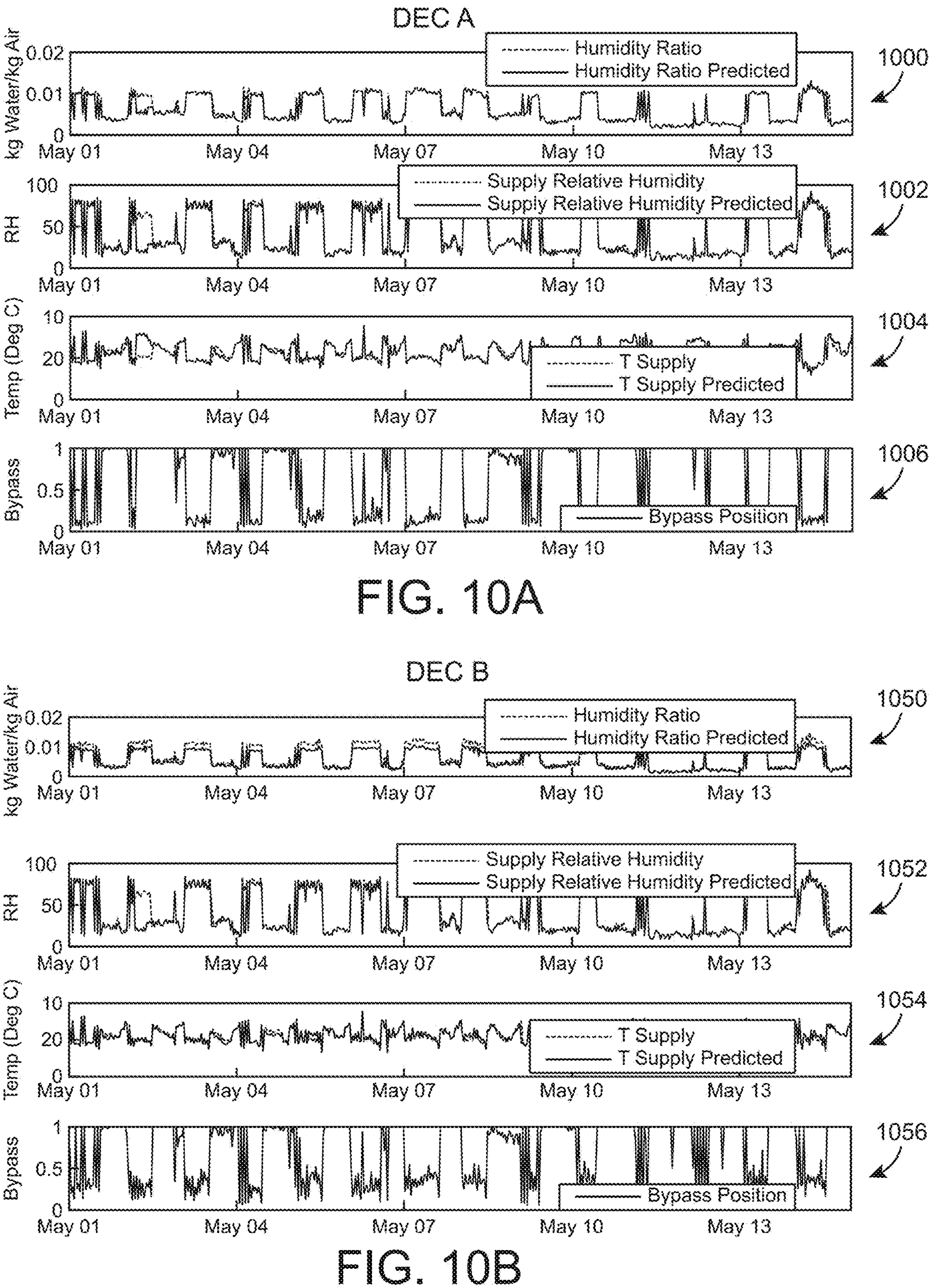
FIG. 10A is a set of graphs relating to an example execution of the process of FIG. 9, according to some embodiments.
FIG. 10B is a set of graphs relating to an example execution of the process of FIG. 9, according to some embodiments.

Estimations determined in step 902 are illustrated in FIGS. 10A-B. FIG. 10A shows set of graphs for a first DEC unit (shown as DEC A, e.g., DEC 102*a* of FIG. 1), including a first graph 1000 comparing measured humidity ratio and predicted (or estimated) humidity ratio, a second graph 1002 showing measured supply relative humidity and predicted (or estimated) supply relative humidity, a third graph 1004 showing measured supply air temperature and predicted (or estimated) supply air temperature, and a fourth graph 1006 showing bypass positions. FIG. 10B shows a set of graphs for a second DEC unit (shown as DEC B, e.g., DEC 102*b* of FIG. 1), including a first graph 1050 comparing measured humidity ratio and predicted (or estimated) humidity ratio, a second graph 1052 showing measured supply relative humidity and predicted (or estimated) supply relative humidity, a third graph 1054 showing measured supply air temperature and predicted (or estimated) supply air temperature, and a fourth graph 1056 showing bypass positions.

At step 904, predicted supply air temperature is compared to measured supply air temperature. Comparing the predicted supply air temperature to the measured supply air temperature can include determining a difference (e.g., gap) between the predicted supply air temperature and the measured supply air temperature (e.g., at a given point in time, summed or integrated over a time period, etc.). In some embodiments, a statistical metric of a difference between the predicted and measured supply air temperatures is assessed (e.g., a variance of the difference, a mean of the difference, a standard deviation of the variance, etc.). Comparing the predicted supply air temperature to the measured supply air temperature can include determine whether such difference, sum of differences, statistical metric, etc. exceeds a corresponding threshold value. If the threshold value is exceed, the comparison can be considered as indicating a discrepancy between the predicted and measured supply air temperatures.

At step 906, predicted supply air humidity is compared to measured supply air humidity. Comparing the predicted supply air humidity to the measured supply air humidity can include determining a difference (e.g., gap) between the predicted supply air humidity and the measured supply air humidity (e.g., at a given point in time, summed or integrated over a time period, etc.). In some embodiments, a statistical metric of a difference between the predicted and measured supply air humidities is assessed (e.g., a variance of the difference, a mean of the difference, a standard deviation of the variance, etc.). Comparing the predicted supply air humidity to the measured supply air humidity can include determine whether such difference, sum of differences, statistical metric, etc. exceeds a corresponding threshold value. If the threshold value is exceed, the comparison can be considered as indicating a discrepancy between the predicted and measured supply air humidities.

In some embodiments, process 900 is performed for a group of DEC units. In such embodiments, process 900 (e.g., the comparisons of steps 904 and 906) can include performing a peer analysis to compare performance of the DEC units and detect outliers. For example, comparing predicted supply air temperatures and measured supply air temperatures in step 904 can include using peer analysis to detect outlier supply air temperatures (predicted or measured) across the group of DEC units. As another example, comparing predicted supply air humidities and measured supply air humidities in step 906 can include using peer analysis to detect outlier supply air humidities (predicted or measured) across the group of DEC units. As another example, the supply air temperatures and humidities can be used to quantified efficiencies of the DEC units which can be compared to each other to detect outliers. Outlier detection may be performed using generalized extreme studentized deviate analysis.

At step 908, a fault is determined to be occurring in response to a discrepancy determined in step 904 or 906. Various faults are possible. For example, if step 904 determines that no discrepancy is occurring for supply air temperature while step 906 determines that a discrepancy is occurring for supply air humidity, step 908 can include determining that a fault is occurring in a humidity sensor measuring the supply air humidity (e.g., humidity sensor 206). FIG. 10B shows an example of such a scenario, where the third graph 1054 shows actual and predicted supply temperatures closely following one another, while gaps appear consistently between the supply relative humidity as predicted and as measured in the second graph 1052 and between the humidity ratio as predicted and as measured in the first graph 1050. Because the expected supply air temperature is still being met, step 908 can infer that the error causing the discrepancy between humidities is a fault in the humidity sensor.

As another example, if step 906 determines that no discrepancy is occurring for supply air humidity while step 904 determines that a discrepancy is occurring for supply air temperature, step 908 can include determining that a fault is occurring in a temperature sensor measuring the supply air temperature (e.g., humidity sensor 206).

As another example, if step 904 determines that supply air temperature as measured is consistently higher than expected (predicted, estimated) and step 906 determines that supply air humidity is consistently lower than expected (but that supply air humidity and supply air temperature maintain an expected relationship), then step 908 can include determining that the DEC unit is operating at less than the expected efficiency or that some other control or equipment fault is occurring. DEC unit efficiency can be lost by degradation of the evaporation media 210, a mechanical problem with the dampers 218/220, a problem with the supply fan 214, etc. Accordingly, in such a scenario, a fault may be determined in step 908 indicating that a loss of efficiency occurred and that the DEC unit may benefit from maintenance.

As another example, if steps 904 and/or 906, if an outlier (discrepancy) is found for one of the DEC units of a group (relative to the others in the group), a fault can be detected. Process 900 can include performing analytical methods and/or model-based calculations to examine the outlier(s) to determine a source of the fault and/or determine a recommendation for resolving the fault (e.g., maintenance steps, automated control actions, etc.).

At step 910, in response to detection of a fault in step 908, operations of the DEC unit can be affected to resolve or compensate for the fault. For example, in an example where the fault indicates that the a sensor is faulty and is providing measurements which deviate from real or expected values by a certain amount, control logic for the DEC unit can be updated to add an offset of said certain amount to measurements from the corresponding sensor before use in control, thereby compensating for the detected fault. As another example, step 908 can include running the DEC unit through a diagnostic or self-repair routine (e.g., flushing the evaporation media 210 with extra water to clear salt build up that may be provide degradation). As another example, step 908 can include ordering and executing a maintenance task for the DEC unit, for example mechanical maintenance, cleaning, sensor replacement, evaporative media replacement, and/or air filter replacement. For example, one or more sensors (e.g., temperature sensor, humidity sensor) can be cleaned, moved (e.g., to a position expected to provide more reliable or useful measurements), replaced (e.g., an existing sensor discarded an a new, replacement sensor installed), or otherwise maintained or adjusted to resolve the sensor fault. Triggering a fault (e.g., triggering a sensor fault) as in steps 908-910 can thereby cause resolution of the fault.

Figure 11A:
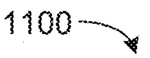
FIG. 11A is a flowchart of a process for modeling operations of a DEC unit, according to some embodiments.
Figure 11A:
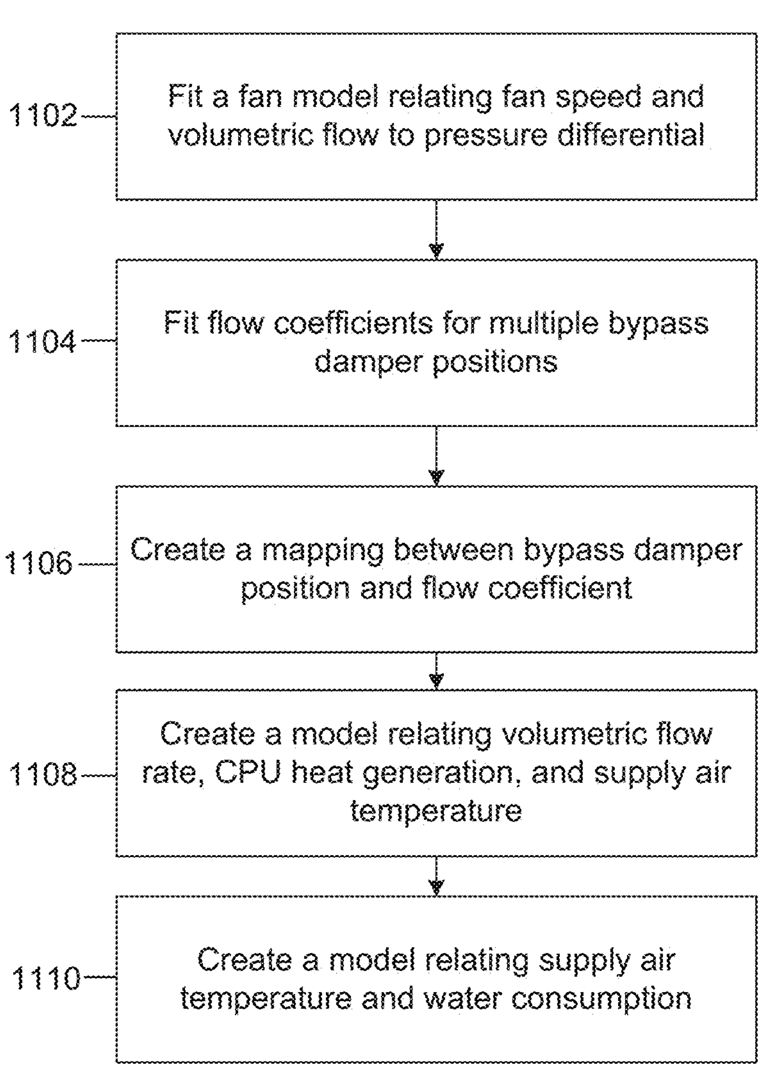

Referring now to FIG. 11A, a flowchart of a process 1100 for creating models that can be used in controlling one or more DEC units is shown, according to some embodiments. In some embodiments, the controller 230 is programmed to execute the process 1100. The models generated in process 1100 can be used in the various control processes described herein, for example process 1200 of FIG. 12 described below.

At step 1102, a fan model relating fan speed and volumetric flow to pressure differential is fit. Step 1102 can use a fan pressure rise formula in which fan pressure rise is a function of volumetric flow rate and fan speed ratio, for example:

$$\Delta\hat{P} = coeff_1 \cdot \text{Speed}^2 \cdot \text{design}_{\Delta P}\left[1 - \left(\frac{\text{flow}}{coeff_2 \cdot \text{Speed}^2 \cdot \text{design}_{flow}}\right)^{coeff_3}\right]$$

Figures 11B, 11C, 11D:
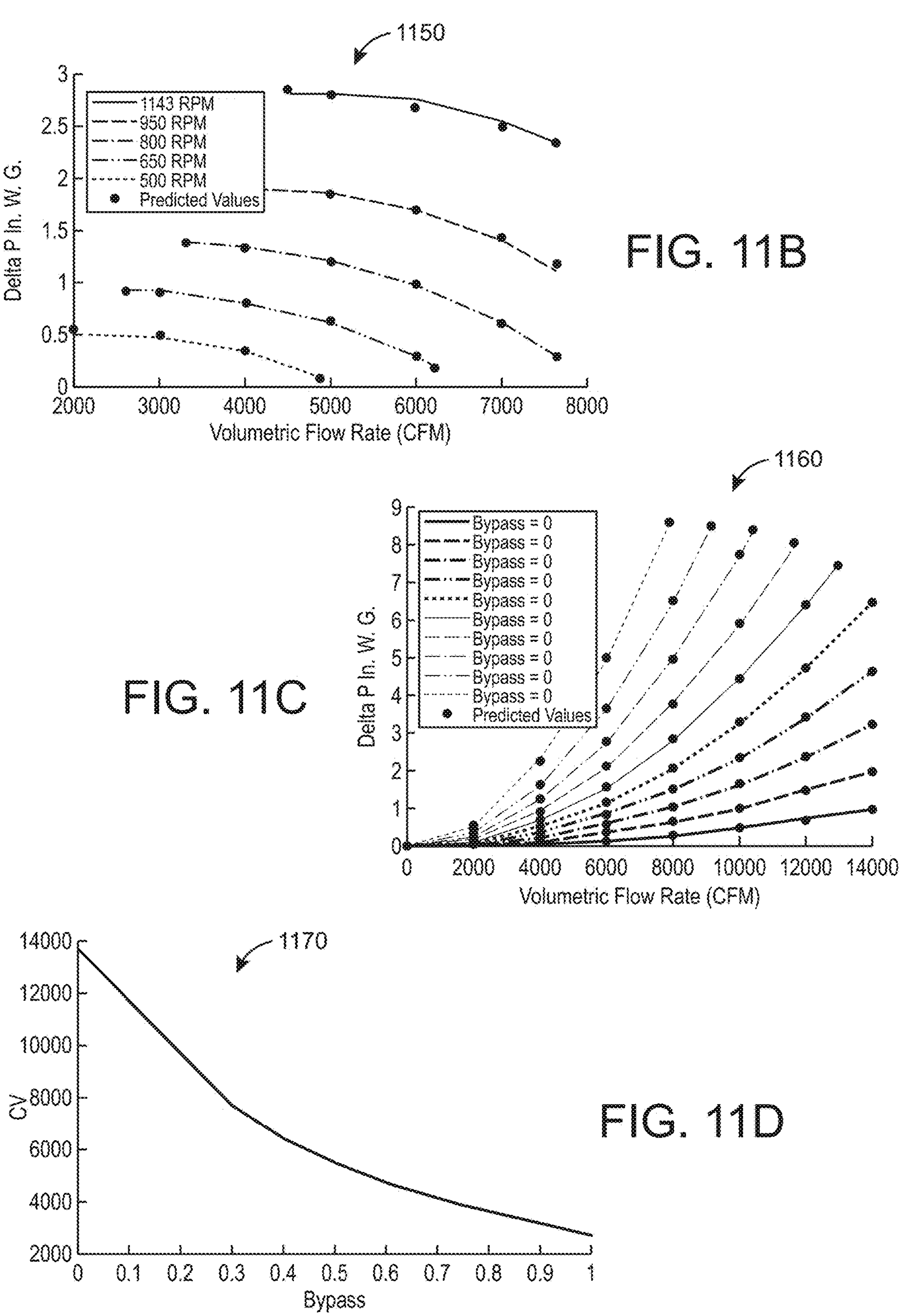
FIG. 11B is a graph illustrating a step of the modeling of the process of FIG. 11A, according to some embodiments.
FIG. 11C is a graph illustrating a step of the modeling of the process of FIG. 11A, according to some embodiments.
FIG. 11D is a graph illustrating a step of the modeling of the process of FIG. 11A, according to some embodiments.

Step 1102 can including fitting the coefficients ($coeff_1$, $coeff_2$, $coeff_3$), for example using a nonlinear least squares approach based on actual fan data (e.g., measured values). The Speed refers to fan speed (e.g., in rotations per minute), f low refers to volumetric flow rate (e.g., cubic meters per hour). The value $design_{\Delta P}$ is an equipment design delta pressure (e.g., from product literature, measured in inches of water column). Design flow ($design_{flow}$) is also an equipment design value (e.g., from product literature, measured in cubic meters per hour). FIG. 11B illustrates a graph 1150 showing curves fit for different fan speed values (different RPM) in a plot having volumetric flow rate (i.e., f low) on the horizontal axis and $\Delta\dot{P}$ on the vertical axis.

At step 1104, flow coefficients are fit for multiple bypass damper positions. Step 1104 can use a function flow=$Cv\sqrt{\Delta P}$ and can determine values of flow coefficient Cv for different bypass positions. Bypass positions can range from a first extremum where the damper is arranged to direct all air through the bypass channel 212 (bypass value=1) to an opposite extremum where the damper is arranged to direct all air through the face channel 208 and the evaporation media 210 (bypass value=0). The bypass value can take any value in between, for example such that a bypass value of 0.3 indicates that 30% of air flow is directed through the bypass channel 212 and 70% of airflow is directed through the face channel 208.

Step 1104 can include fitting a curve for each of a set of bypass positions, for example ten or eleven bypass positions ranging from bypass=0 to bypass=1 (e.g. by increments of 0.1), for example based on real data (e.g., measured values). An example of such curves is shown in FIG. 11C in a graph 1160, which are used to find a value of the flow coefficient Cv at each bypass position assessed.

At step 1106, a mapping between bypass damper position and flow coefficient is created. For example, the discrete values for flow coefficient Cv at multiple damper positions from step 1104 can then be used in an interpolation to find a continuous function that determines flow coefficient Cv for any bypass value, for example as plotted in graph 1170 of FIG. 11D. Step 1106 thereby provides a mapping between bypass damper position and flow coefficient.

At step 1108, a model relating volumetric flow rate, CPU heat generation, and supply air temperature is created. The model used in step 1108 may be a regression model based on site data that maps a required volumetric flow rate (f low) to CPU heat generation ($Q_{cpu}$) and supply air temperature ($T_{supply}$) for example based on the function $Q_{cpu}$=flow*$C_p$($T_{hot}$−$T_{supply}$) where $C_p$ is a heat transfer coefficient. The relationship in step 1108 may be based on a constraint, limit, target, etc. for $T_{hot}$ (hot aisle temperature), for example a goal of keeping $T_{hot}$ substantially constant by increasing or decreasing f low and/or $T_{supply}$ to adjust for different levels of $Q_{cpu}$.

At step 1110, a model relating supply air temperature and water consumption is created. The model created in step 1110 may be a water mass balance, for example based on design efficiency values of the DEC unit. The model created at step 1110 may be similar to water evaporation modeling discussed above, for example based on the following rules:

$$\dot{m}_u = \dot{m}_{u,d} + \dot{m}_e;\ \dot{m}_{u,d} = \frac{c_u}{(c_{limit} - c_u)}\dot{m}_e$$

after the initial purchase has been used; Tank must not be in service for more than N days without flushing; and $\dot{m}_e h_{evap} = p_{air} c_p w_s (T_{oa} - T_s)$ The model created in step 1110 can determine an amount of water evaporated as a function of outdoor air temperature, outdoor air humidity, volumetric air flow (flow, $w_s$), and/or supply air temperature. The model of step 1110 can be used to determine a total amount of water consumption over a time period based on values of one or more of such variables over the time period. Process 1100 thereby provides a set of interrelated models and equations that can be used in a control process, for example as constraints on an optimization. Process 1200 provides an example process in which equipment is controlled using the models created in process 1100. Other control processes based on one or more of the models from process 1100 can be implemented in various embodiments.

Figure 12:
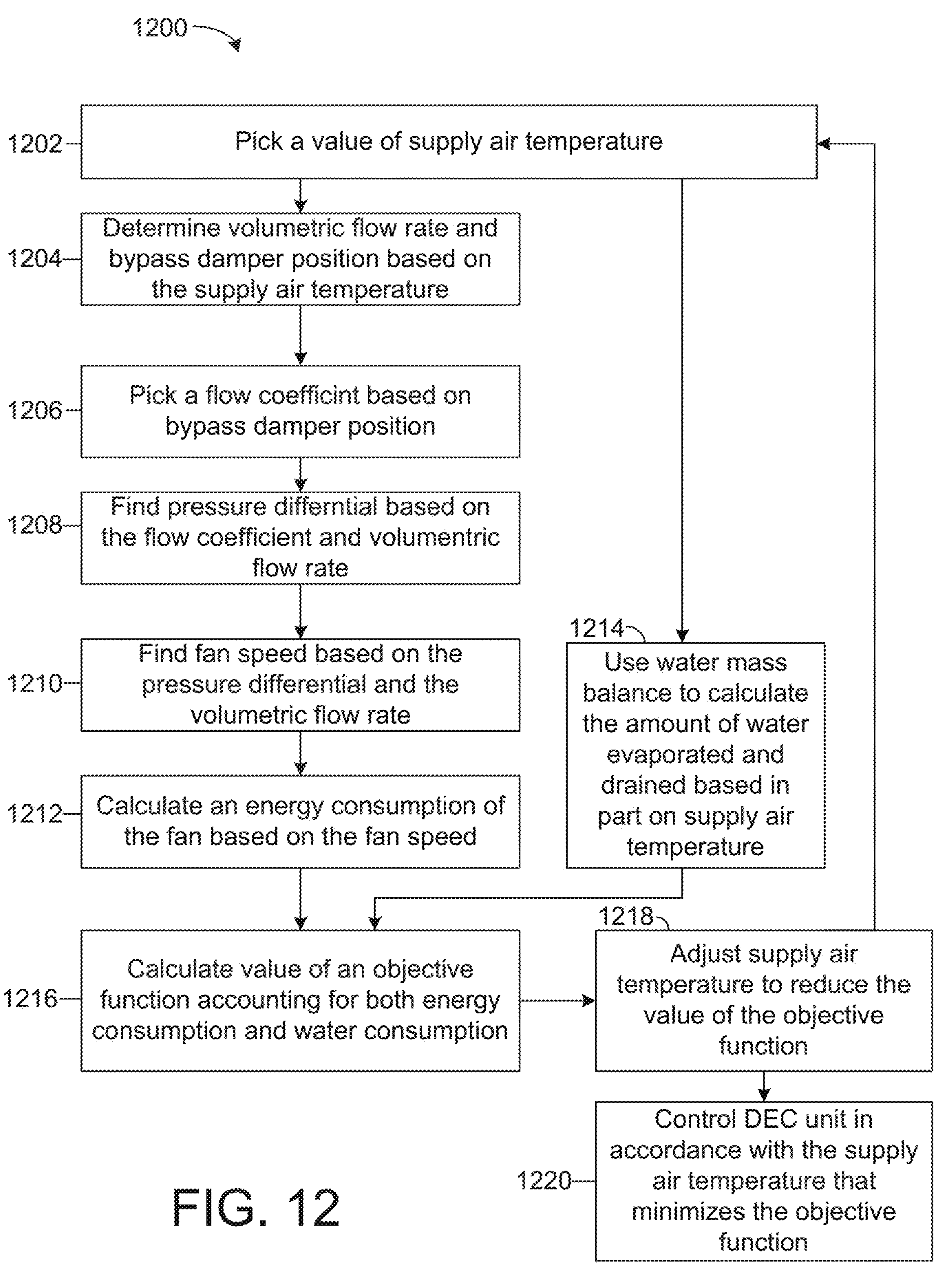
FIG. 12 is a flowchart of a process for controlling a DEC unit, for example using models from the process of FIG. 11A, according to some embodiments.

Referring now to FIG. 12, a process 1200 for optimizing control of a DEC unit is shown, according to some embodiments. In some embodiments, the controller 230 is programmed to execute the process 1200. Process 1200 can use the models created in process 1100, in some embodiments.

At step 1202, a value of supply air temperature is picked. In a first instance of step 1202, the selected value of supply air temperature initiates an optimization. The selected value may be a value used for control in a preceding time step, in some embodiments.

At step 1204, a volumetric flow rate and bypass damper position are determined based on the supply air temperature. The bypass position can be determined using a DEC efficiency model as described above, for example according to $T_{supply}$=Bypass*$T_{oa}$+(1−Bypass)*DEC Cooled T, where DEC Cooled T=Dry Bulb T−Efficiency*(Dry Bulb T−Wet Bulb T) and Efficiency is a given value from DEC unit product documentation (e.g., 92%). Such equations can be used with the selected supply air temperature from step 1202 and outdoor air temperature (e.g., from a weather service, from a sensor) to determine a bypass position (i.e., a value for Bypass).

The volumetric flow rate can be determined in step 1204 using a model that relates volumetric flow rate, CPU heat generation, and supply air temperature, for example a model output from step 1108 of process 1100 and described with reference thereto. The volumetric flow rate may be based on a predicted CPU heat generation, for example (e.g., a load prediction). Step 1204 thereby outputs a volumetric flow rate and a bypass damper position.

At step 1206, a flow coefficient Cv is picked based on the bypass damper position. Step 1206 can be performed using the function output from step 1106 of process 1100 (e.g., a function as illustrated in graph 1170 of FIG. 11D). A value of Cv is thereby determined.

At step 1208, a pressure differential is found based on the flow coefficient (Cv) from step 1206 and the volumetric flow rate (flow) from step 1204. The pressure differential can be calculated according to the function flow=Cv$\sqrt{\Delta P}$ discussed with reference to step 1104 of process 1100. That is, step 1208 can calculate the pressure differential as $$\Delta P = \left(\frac{\text{flow}}{Cv}\right)^2.$$

At step 1210, a fan speed is found based on the pressure differential ΔP from step 1208 and the volumetric flow rate flow from step 1204. Step 1210 can use the fan model from step 1102, for example:

$$\Delta P = coeff_1 \cdot \text{Speed}^2 \cdot \text{design}_{\Delta P}\left[1 - \left(\frac{\text{flow}}{coeff_2 \cdot \text{Speed}^2 \cdot \text{design}_{flow}}\right)^{coeff_3}\right].$$

When ΔP and flow (with other values fit in process 1100, for example), fan speed (i.e., Speed) is the remaining unknown variable. Step 1210 can include running a solver (e.g., quadratic solver logic, numerical approach, etc.) to find a positive value for Speed which satisfies the equation. The required fan speed for providing the supply air temperature selected in step 1202 is thereby determined.

In step 1214, a water mas balance is used to calculate the amount of water evaporated and/or drained based in part on supply air temperature. Step 1214 can account for all water to be consumed by the DEC over a time horizon. Step 1214 can use the model as created in step 1110 of process 1100, for example.

At step 1216 a value of an objective function that accounts for both energy consumption and water consumption is calculated, based on outputs of steps 1212 and 1214. The objective function may have the form:

$$\Big[\text{Water Cost} \times \text{Gallons Consumed} + \text{Power Cost} \times \textit{DesignFan}\ \text{Power}\ \textit{Consumpotion} \times \left(\frac{\text{Fan Speed}}{\text{Design Fan Speed}}\right)^3$$

The function accounts for the cost of water consumption of the DEC unit and the cost of power consumption (e.g., electrical consumption) of the fan of the DEC unit. The objective function address tradeoffs between water and fan power consumption, i.e., because water consumption and fan speed can be competing objectives as increasing water consumption can provide colder supply air which requires lower fan speed to provide a same amount of cooling. The water cost and the power cost terms may be rates set by utility companies and/or may be adjustable weights set by user preferences for water usage relative to electrical usage (e.g., based on competing sustainability objectives). In some embodiments, the power cost is tied to (e.g., internalizes) a marginal carbon emissions rate associated with marginal increases in fan power consumption, such that carbon emissions considerations are considered by the objective function. As another example, a penalty term may be applied to penalize water usage that goes above an upper bound (e.g., set by sustainability goals, set by government regulators, etc.). Various other costs and penalties can be represented in the objective function in various embodiments.

Step 1216 provides a value of the cost function given the supply air temperature selected in step 1202. At step 1218, the supply air temperature is adjusted in an effort to reduce the value of the objective function and the process returns to step 1202 where the adjusted value is used as the supply air temperature input to initialize steps 1204-1216 of the process 1200. The steps 1202-1218 can be repeated so that values of the objective function are calculated for different supply air temperatures, for example using a gradient descent or other optimization method to select supply air temperatures in 1218 expected to drive the objective function to an optimal value. Thus, after iterating through steps 1202-1218, a supply air temperature which minimizes the value of the objective function is determined.

At step 1220, the DEC unit is controlled in accordance with the supply air temperature which minimizes the value of the objective function. Step 1220 can include controlling the supply fan 214 and the actuator 216, for example. Process 1200 can be repeated regularly, e.g., every minute, every fifteen minutes, etc. to provide optimal control of the DEC unit over time. The DEC unit is thereby controlled in a manner which accounts for tradeoffs between consuming more water to reduce fan power consumption and consuming more power with the fan to reduce water consumption. Benefits of such an approach are demonstrated in experimental results shown in FIGS. 13-16 and discussed below.

In some embodiments, process 1200 is performed for a group of DEC units. A supply air temperature output from the optimization may be used as an overall control target for the group of DEC units. Controlling the group of DEC units may further include allocating load across the group of DEC units, for example by distributing water consumption and fan power consumption among the individual DEC units by running a second optimization constrained to provide the same overall supply air temperature output from process 1200. For example, it may be more efficient to provide a larger amount of evaporative cooling with one DEC unit while other DEC units fully bypass evaporative cooling, as compared to providing a small amount of evaporative cooling equally from all DEC units, while both scenarios achieve the same overall supply air temperature. Accordingly, controlling a group of DEC units can include running process 1200 to determine a target overall supply air temperature and then using that target overall supply air temperature as a constraint on a second optimization which determines an allocation of loads across the group of DEC units which optimally achieves the target overall supply air temperature.

Figure 13:
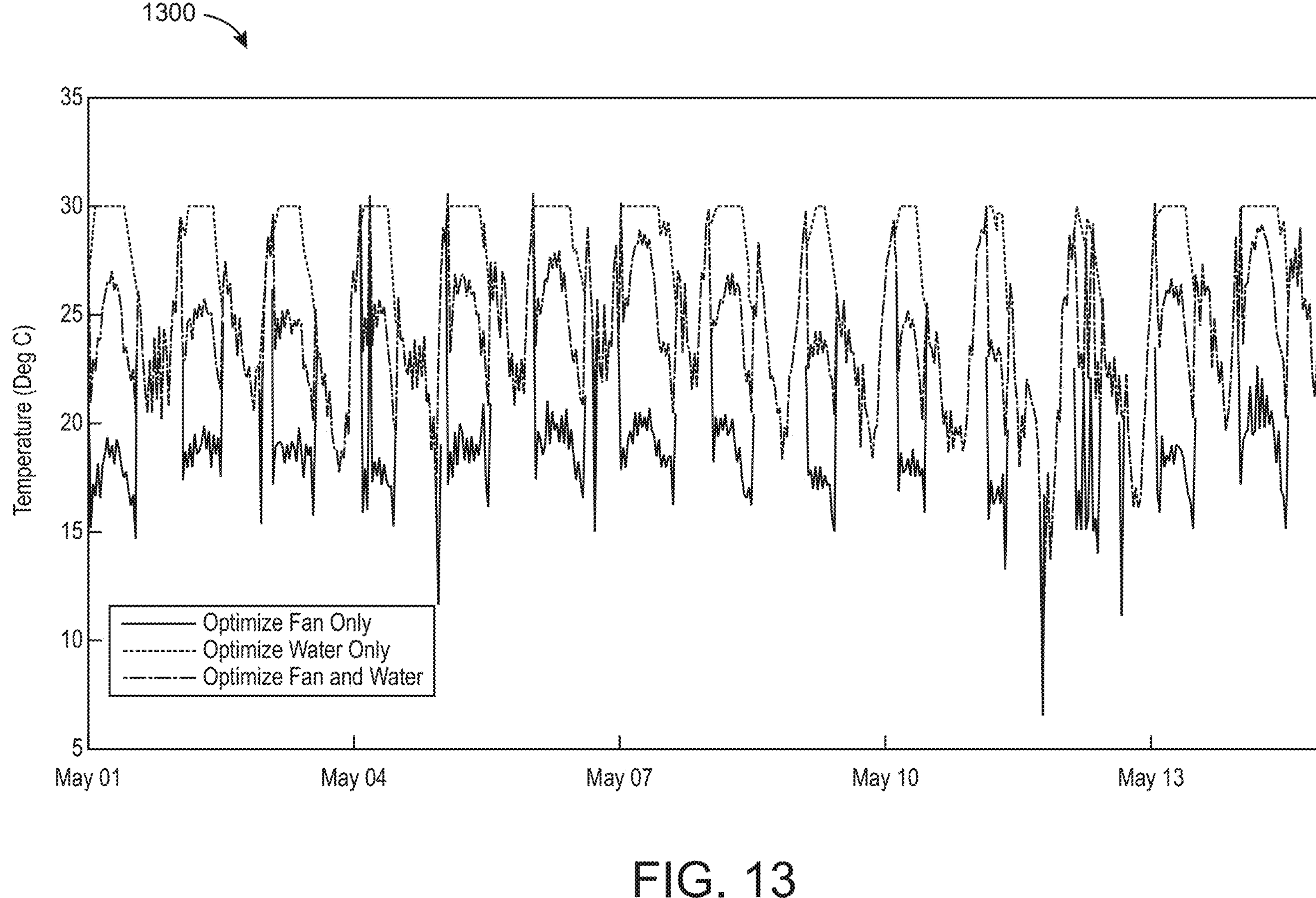
FIG. 13 is a graph relating to control of a DEC unit, according to some embodiments.

Referring now to FIG. 13, a graph 1300 is shown, according to some embodiments and experimental results. The graph 1300 compares the supply air temperature values which are determined by optimizing fan power usage only, optimizing water usage only, or optimizing fan power and water consumption together (as in process 1200), over a time period. As illustrated, optimizing fan only provides lower supply air temperatures, as fan optimization relies on increased use of direct evaporative cooling (and thus more water consumption) in order to reduce the required fan speed to provide sufficient cooling. Alternatively, optimizing water usage only provides higher supply air temperatures, thereby requiring more fan speed to provide higher flow rate while reducing use of evaporative cooling (and corresponding water consumption). Graph 1300 further shows that optimizing fan and water consumption together provides supply air temperatures between those provided by the other two approaches, representing a middle approach that provides a balance between water consumption savings and fan power savings.

Figure 14:
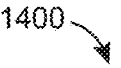
FIG. 14 is a set of graphs relating to control of a DEC unit, according to some embodiments.
Figure 14:
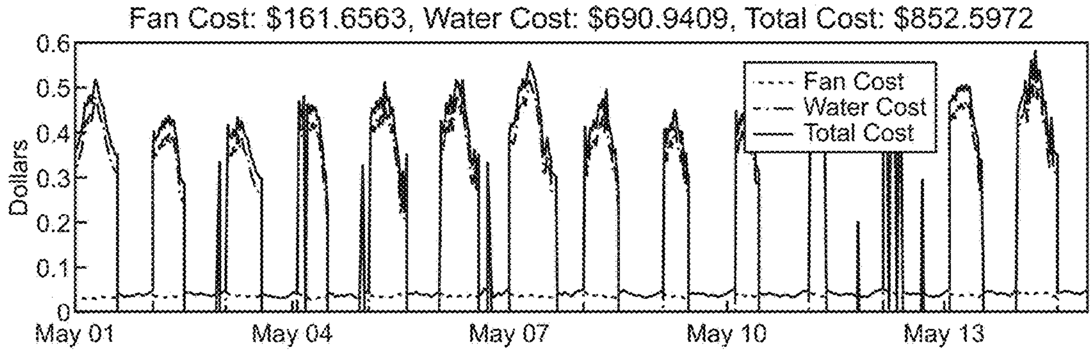
Figure 14:
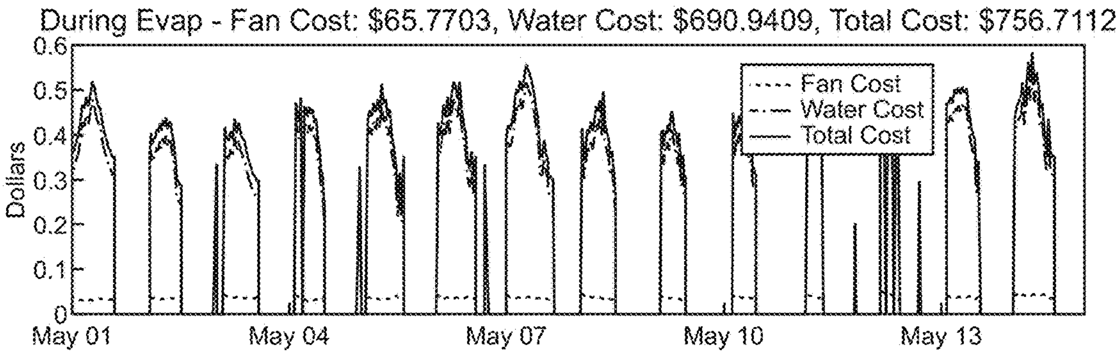
Figure 14:
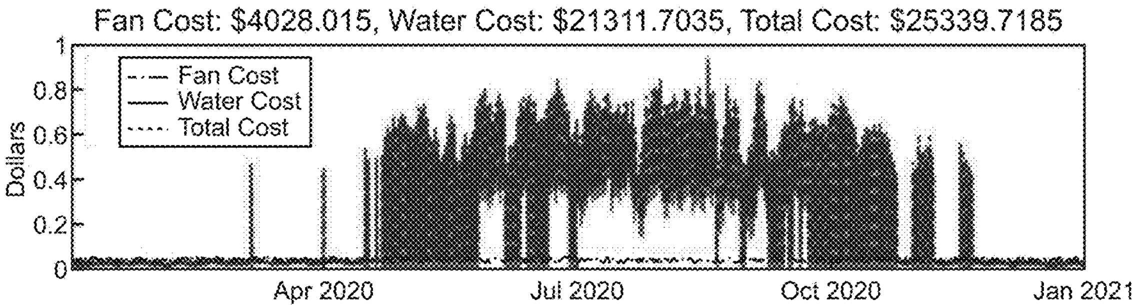
Figure 14:
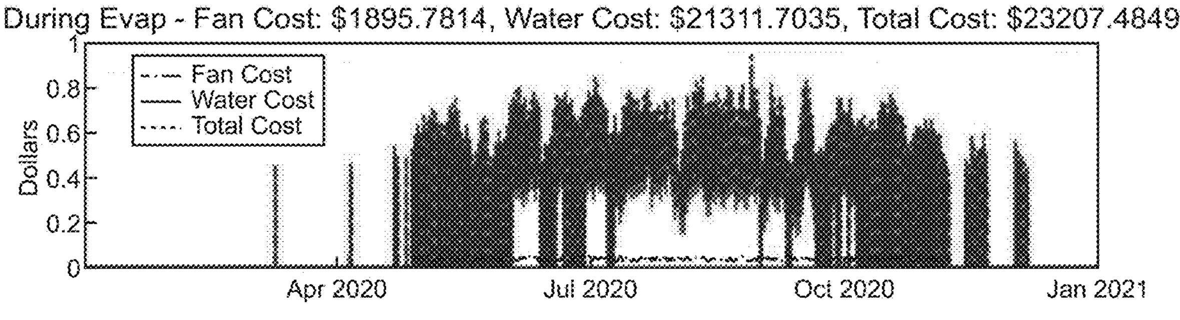
Figure 15:
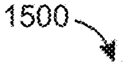
FIG. 15 is a set of graphs relating to control of a DEC unit, according to some embodiments.
Figure 15:
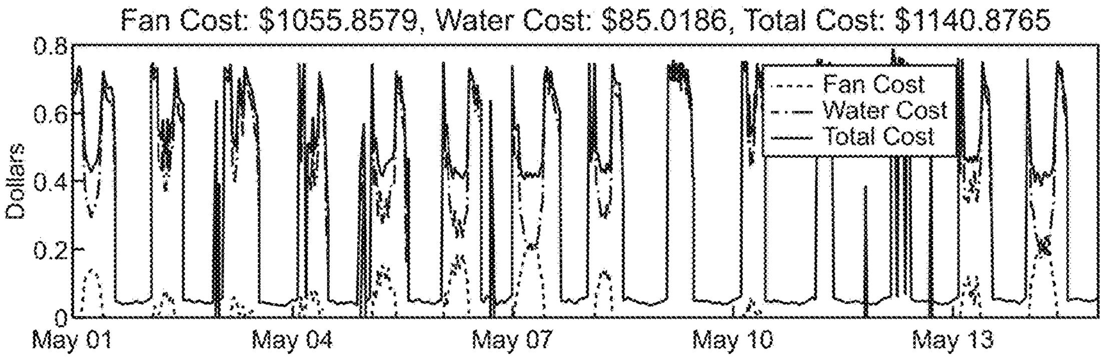
Figure 15:
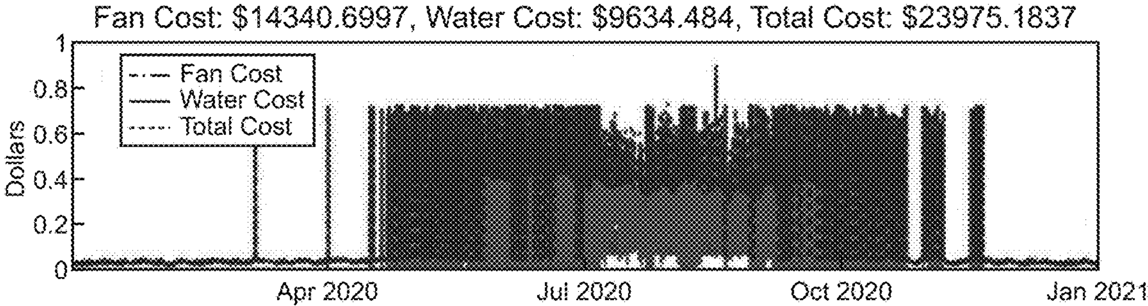
Figure 16:
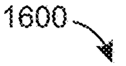
FIG. 16 is a set of graphs relating to control of a DEC unit, according to some embodiments.
Figure 16:
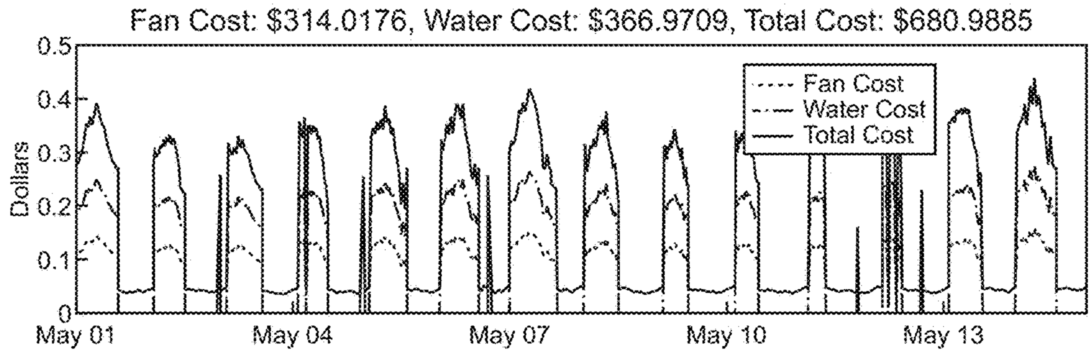
Figure 16:
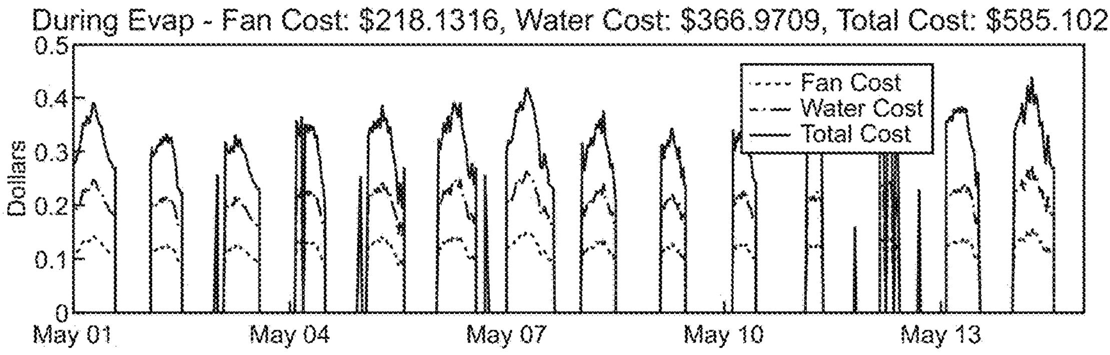
Figure 16:
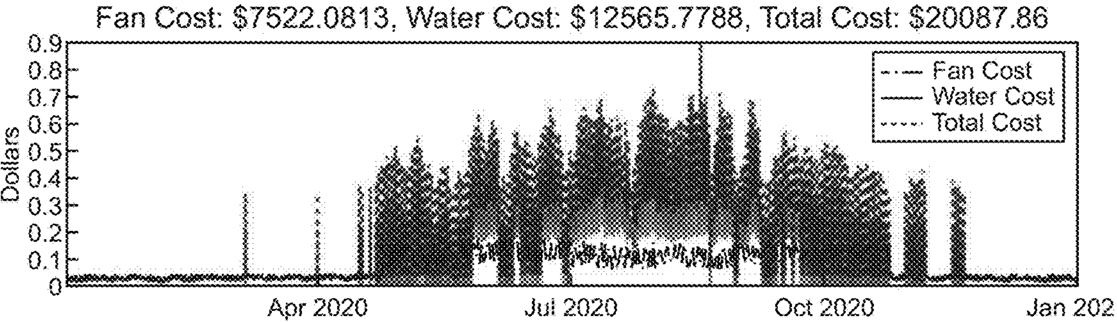
Figure 16:
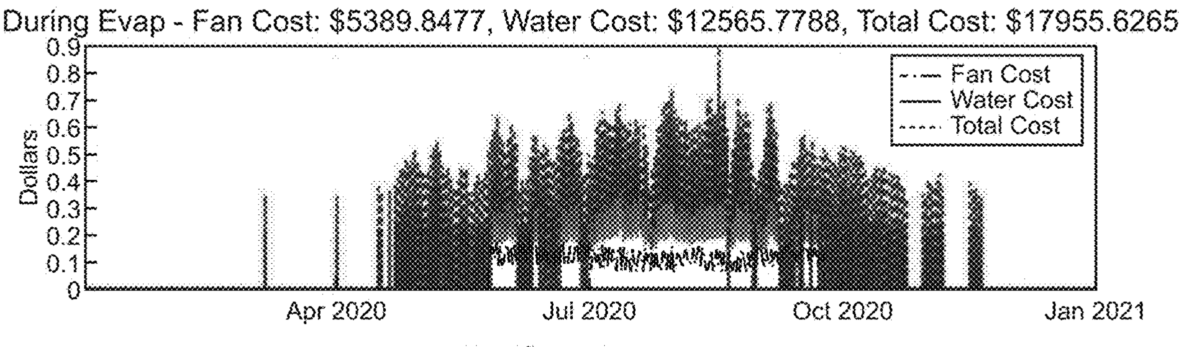

Referring now to FIGS. 14-16, sets of graphs are shown, according to some embodiments and experimental results, which further illustrate the advantages of integrated optimization of water consumption and fan power as in process 1200. FIG. 14 shows a set of graphs 1400 illustrating fan and water costs in scenarios where fan power only is optimized (i.e., water consumption is not accounted for in control). FIG. 15 shows a set of graphs 1500 illustrating fan and water costs in scenarios where water power only is optimized (i.e., fan power is not accounted for in control). The graphs 1500 shows that water costs are greatly reduced (e.g., by 87% in one period) relative to the fan-focused approach of the graphs 1400, but that fan power consumption is increased (such that overall costs may increase). FIG. 16 shows a set of graphs 1600 illustrating fan and water costs in scenarios where both water and fan power costs are accounted for in a control optimization (e.g., according to process 1200). The graphs 1600 illustrate that overall costs are reduced relative to the other examples (e.g., by more than 20% during evaporation periods) and that water consumption remains significantly reduced relative to the example of FIG. 14 (e.g., by 47% during evaporation periods). The results of FIGS. 14-16 thereby prove the effectiveness of the various features described herein.

Various other control strategies can be implemented in various embodiments. For example, in some embodiments the optimization (e.g., as in process 1200) is formulated as a multi-objective optimization where costs of water and electricity adjusted in order to build a Pareto front. An operating point can then be selected based on the Pareto front, e.g., by inspection of how much waters savings are achieved for various levels of electricity savings. As another example, for a data center served by multiple DEC units as in FIG. 1, fan energy may be saved by running half of the DEC units dry with all dampers wide open any time less than half the cooling is needed. If more than half the cooling is needed to be optimal additionally comparing if half units off would run at a lower cost and keep the temperature under the acceptable bound, which would become the new optimal. As another example, a high-level/low-level optimization architecture can be provide where load can be allocated across multiple DEC units, e.g., to find the optimal way to serve any combination of flow and temperature from N DEC units in a high level optimization, and then during runtime use a lower level optimization to find optimal operating points for each DEC unit in accordance with decisions/allocations made at the high level optimization.

The hardware and data processing components used to implement the various processes, operations, illustrative logics, logical blocks, modules and circuits described in connection with the embodiments disclosed herein may be implemented or performed with a general purpose single- or multi-chip processor, a digital signal processor (DSP), an application specific integrated circuit (ASIC), a field programmable gate array (FPGA), or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some embodiments, particular processes and methods may be performed by circuitry that is specific to a given function. The memory (e.g., memory, memory unit, storage device) may include one or more devices (e.g., RAM, ROM, Flash memory, hard disk storage) for storing data and/or computer code for completing or facilitating the various processes, layers and modules described in the present disclosure. The memory may be or include volatile memory or non-volatile memory, and may include database components, object code components, script components, or any other type of information structure for supporting the various activities and information structures described in the present disclosure. According to an exemplary embodiment, the memory is communicably connected to the processor via a processing circuit and includes computer code for executing (e.g., by the processing circuit or the processor) the one or more processes described herein.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

What is claimed is:

1. A method for fault detection for direct evaporative cooling of a data center, wherein the direct evaporative cooling affects a humidity and a temperature of the data center, the method comprising:

generating expected values for the humidity of the data center and expected values for the temperature of the data center using a model based on a design efficiency of a direct evaporative cooling unit;

triggering a sensor fault in response to:
measured values for the humidity deviating from the expected values for the humidity while measured values for the temperature track the expected values for the temperature; or
the measured values for the temperature deviating from the expected values for the temperature while the measured values for the humidity track the expected values for the humidity; and
determining a degradation of the design efficiency based on a comparison of the expected values to the actual values.

2. The method of claim 1, comprising executing an action to resolve the sensor fault in response to triggering the sensor fault.

3. The method of claim 2, wherein executing the action to resolve the sensor fault comprises moving a sensor, cleaning the sensor, or replacing the sensor.

4. The method of claim 1, comprising altering control of the direct evaporative cooling of the data center to adapt to the fault condition.

5. The method of claim 1, wherein the model uses inputs comprising a bypass profile and at least one of outdoor air temperature or outdoor air humidity value.

6. The method of claim 1, further comprising abstaining from triggering the sensor fault in response to the measured values for the humidity deviating from the expected values for the humidity and the measured values for the temperature deviating from the expected values for the temperature.

7. The method of claim 1, wherein the model is a physics-based model based on the design efficiency of the direct evaporative cooling unit.

8. The method of claim 7, wherein the physics-based model uses a bypass position of the direct evaporative cooling unit, an outdoor air temperature, or an outdoor air humidity as an input.

9. A method for sensor fault detection for a first sensor that measures a first condition and a second sensor that measures a second condition, wherein equipment is operable to affect the first condition and the second condition, the method comprising:

generating expected values for the first condition and corresponding expected values for the second condition using a physics-based model that defines a physics-based relationship between the first condition and the second condition; and
triggering a sensor fault in response to determining that measured values for the first condition deviate from the expected values for the first condition and measured values for the second condition track the expected values for the second condition; and
abstaining from triggering the sensor fault in response to determining that the measured values for the first condition deviate from the expected values for the first condition and the measured values for the second condition deviate from the expected values for the second condition.

10. The method of claim 9, comprising executing an action to resolve the sensor fault in response to indicating the sensor fault.

11. The method of claim 10, wherein executing the action to resolve the sensor fault comprises moving the first sensor or the second sensor, cleaning the first sensor or the second sensor, or replacing the first sensor or the second sensor.

12. The method of claim 9, comprising altering control of direct evaporative cooling of a data center to adapt to the fault condition.

13. The method of claim 9, wherein the physics-based model uses a bypass position of a direct evaporative cooling unit, an outdoor air temperature, or an outdoor air humidity as an input.

14. The method of claim 9, wherein the physics-based model is based on an efficiency of a direct evaporative cooling unit.

15. The method of claim 9, wherein the first sensor measures a supply air humidity of a direct evaporative cooling unit and the second sensor measures a supply air temperature of a direct evaporative cooling unit.

16. The method of claim 9, further comprising triggering, when abstaining from triggering the sensor fault, a control and/or equipment fault.

17. A method for sensor fault detection for a first sensor that measures a first indoor air condition and a second sensor that measures a second indoor air condition, the method comprising:

determining an expected relationship between the first indoor air condition and the second indoor air condition based on thermodynamic principles;
evaluating first measurements of the first indoor air condition from the first sensor and second measurements of the second indoor air condition from the second sensor to determine whether the first and second measurements satisfy the expected relationship between the first indoor air condition and the second indoor air condition;
triggering a fault in the first sensor or the second sensor in response to determining that the first measurements from the first sensor and the second measurements from the second sensor do not satisfy the expected relationship between the first indoor air condition and the second indoor air condition; and
performing, in response to the fault, one or more of cleaning, moving, or replacing the first sensor or the second sensor.

18. The method of claim 17, wherein the first sensor and the second sensor are associated with a first unit of a plurality of equipment units, the method further comprising attributing the fault to the first sensor or the second sensor by performing peer analysis for the plurality of equipment units.

19. The method of claim 18, wherein performing the peer analysis comprises determining whether the measurements from the first sensor or the measurements from the second sensor are outliers.

20. The method of claim 18, wherein performing the peer analysis comprises using a generalized extreme studentized deviate.

* * * * *